US012784830B2

(12) United States Patent
Ko et al.

(10) Patent No.: US 12,784,830 B2
(45) **Date of Patent: *Nov. 3, 2026**

(54) NON-VOLATILE MEMORY DEVICE

(71) Applicant: SAMSUNG ELECTRONICS CO., LTD., Suwon-si (KR)

(72) Inventors: Kuihan Ko, Seoul (KR); Sangwon Park, Seoul (KR); Minyong Kim, Suwon-si (KR); Jekyung Choi, Hwaseong-si (KR); Junho Choi, Gwangju-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 113 days.

This patent is subject to a terminal disclaimer.

(21) Appl. No.: 18/819,002

(22) Filed: Aug. 29, 2024

(65) Prior Publication Data

US 2024/0428857 A1 Dec. 26, 2024

Related U.S. Application Data

(63) Continuation of application No. 17/742,879, filed on May 12, 2022, now Pat. No. 12,100,452.

(30) Foreign Application Priority Data

Sep. 29, 2021 (KR) ........................ 10-2021-0128945

(51) Int. Cl.
*G11C 16/04* (2006.01)
*G11C 5/06* (2006.01)
(Continued)

(52) U.S. Cl.
CPC .......... *G11C 16/0433* (2013.01); *G11C 5/063* (2013.01); *G11C 16/0483* (2013.01);
(Continued)

(58) Field of Classification Search
CPC . G11C 16/0433; G11C 16/3427; G11C 5/063; G11C 11/5628; G11C 11/5671;
(Continued)

(56) References Cited

U.S. PATENT DOCUMENTS 8,514,625 B2 8/2013 Shim et al.
8,942,046 B2 1/2015 Kwak
(Continued)

FOREIGN PATENT DOCUMENTS

KR 10-2019-0001624 A 1/2019
KR 10-2020-0107341 A 9/2020
(Continued)

OTHER PUBLICATIONS

Communication issued on Nov. 26, 2025 by the Korean Intellectual Property Office in the Korean Patent Application No. 10-2021-0128945.

(Continued)

*Primary Examiner* — Woo H Choi
(74) *Attorney, Agent, or Firm* — Sughrue Mion, PLLC

(57) ABSTRACT

A non-volatile memory device is provided. The memory device includes: word lines stacked on a substrate; a string select lines on the word lines, the string select lines being spaced apart from each other in a first horizontal direction and extending in a second horizontal direction; and a memory cell array including memory blocks, each of which includes memory cells connected to the word lines and the string select lines. The string select lines include a first string select line, and a second string select line which is farther from a word line cut region than the first string select line, and a program operation performed on second memory cells connected to a selected word line and the second string select line is performed before a program operation per-
(Continued)

formed on first memory cells connected to the selected word line and the first string select line.

26 Claims, 27 Drawing Sheets

(51) Int. Cl.

| | |
|---|---|
| ***G11C 16/08*** | (2006.01) |
| ***G11C 16/10*** | (2006.01) |
| ***G11C 16/24*** | (2006.01) |
| ***G11C 16/26*** | (2006.01) |
| ***H10B 43/10*** | (2023.01) |
| ***H10B 43/27*** | (2023.01) |
| ***H10B 43/35*** | (2023.01) |
| ***H10B 43/40*** | (2023.01) |

(52) U.S. Cl.
CPC .............. *G11C 16/08* (2013.01); *G11C 16/10* (2013.01); *G11C 16/102* (2013.01); *G11C 16/24* (2013.01); *G11C 16/26* (2013.01); *H10B 43/10* (2023.02); *H10B 43/27* (2023.02); *H10B 43/35* (2023.02); *H10B 43/40* (2023.02)

(58) Field of Classification Search
CPC ..... G11C 16/0483; G11C 16/08; G11C 16/10; G11C 16/102; G11C 16/24; G11C 16/26; G11C 2211/5648; H10B 43/10; H10B 43/27; H10B 43/35; H10B 43/40
See application file for complete search history.

(56) References Cited

U.S. PATENT DOCUMENTS

| | | | | |
|---|---|---|---|---|
| 8,982,626 | B2 | 3/2015 | Dong et al. | |
| 9,025,383 | B2 | 5/2015 | Nam et al. | |
| 9,959,932 | B1 | 5/2018 | Zhang et al. | |
| 10,325,657 | B2 | 6/2019 | Shim et al. | |
| 10,541,033 | B2 | 1/2020 | Jung et al. | |
| 11,031,084 | B1 | 6/2021 | Lee et al. | |
| 2013/0262751 | A1 | 10/2013 | Kwak | |
| 2013/0326312 | A1 | 12/2013 | Lee et al. | |
| 2014/0362645 | A1 | 12/2014 | Dong et al. | |
| 2016/0372198 | A1 | 12/2016 | Lee et al. | |
| 2017/0373084 | A1 | 12/2017 | Shim et al. | |
| 2019/0304554 | A1* | 10/2019 | Kim ...................... | G11C 16/08 |
| 2020/0357473 | A1 | 11/2020 | Lee | |
| 2020/0357474 | A1 | 11/2020 | Yun et al. | |
| 2020/0395090 | A1 | 12/2020 | Kang et al. | |

FOREIGN PATENT DOCUMENTS

| | | |
|---|---|---|
| KR | 10-2020-0129239 A | 11/2020 |
| KR | 10-2021-0026617 A | 3/2021 |

OTHER PUBLICATIONS

Communication Issued on Feb. 17, 2023 by the European Patent Office in Corresponding European Patent Application No. 22186720.3.

U.S. Appl. No. 17/742,879, filed May 12, 2022.

* cited by examiner

FIG. 9B

| T2B Normal Scramble - 6SSL | | | | | | |
|---|---|---|---|---|---|---|
| Physical WL | SSL1 | SSL2 | SSL3 | SSL4 | SSL5 | SSL6 |
| Inner/Outer | GR_O (outer) | GR_I (inner) | GR_O (outer) | GR_O (outer) | GR_I (inner) | GR_O (outer) |
| WLn | 3 | 1 | 5 | 4 | 2 | 6 |
| WLn-1 | 9 | 7 | 11 | 10 | 8 | 12 |
| ... | ... | ... | ... | ... | ... | ... |
| WL2 | A-9 | A-11 | A-7 | A-8 | A-10 | A-6 |
| WL1 | A-3 | A-5 | A-1 | A-2 | A-4 | A |

FIG. 9C

| B2T Normal Scramble - 6SSL | | | | | | |
|---|---|---|---|---|---|---|
| Physical WL | SSL1 | SSL2 | SSL3 | SSL4 | SSL5 | SSL6 |
| Inner/Outer | GR_O (outer) | GR_I (inner) | GR_O (outer) | GR_O (outer) | GR_I (inner) | GR_O (outer) |
| WLn | A-3 | A-5 | A-1 | A-2 | A-4 | A |
| WLn-1 | A-9 | A-11 | A-7 | A-8 | A-10 | A-6 |
| ... | ... | ... | ... | ... | ... | ... |
| WL2 | 9 | 7 | 11 | 10 | 8 | 12 |
| WL1 | 3 | 1 | 5 | 4 | 2 | 6 |

FIG. 10B

| T2B Normal Scramble - 6SSL | | | | | | |
|---|---|---|---|---|---|---|
| Physical WL | SSL1 | SSL2 | SSL3 | SSL4 | SSL5 | SSL6 |
| Inner/Outer | GR_O (outer) | GR_I (inner) | GR_O (outer) | GR_O (outer) | GR_I (inner) | GR_O (outer) |
| WLn | 3 | 1 | 4 | 5 | 2 | 6 |
| WLn-1 | 9 | 7 | 10 | 11 | 8 | 12 |
| ... | ... | ... | ... | ... | ... | ... |
| WL2 | A-9 | A-11 | A-8 | A-7 | A-10 | A-6 |
| WL1 | A-3 | A-5 | A-2 | A-1 | A-4 | A |

FIG. 10C

| B2T Normal Scramble - 6SSL | | | | | | |
|---|---|---|---|---|---|---|
| Physical WL | SSL1 | SSL2 | SSL3 | SSL4 | SSL5 | SSL6 |
| Inner/Outer | GR_O (outer) | GR_I (inner) | GR_O (outer) | GR_O (outer) | GR_I (inner) | GR_O (outer) |
| WLn | A-3 | A-5 | A-2 | A-1 | A-4 | A |
| WLn-1 | A-9 | A-11 | A-8 | A-7 | A-10 | A-6 |
| ... | ... | ... | ... | ... | ... | ... |
| WL2 | 9 | 7 | 10 | 11 | 8 | 12 |
| WL1 | 3 | 1 | 4 | 5 | 2 | 6 |

FIG. 11B

| T2B Normal Scramble - 8SSL | | | | | | | | |
|---|---|---|---|---|---|---|---|---|
| Physical WL | SSL1 | SSL2 | SSL3 | SSL4 | SSL5 | SSL6 | SSL7 | SSL8 |
| Inner/Outer | GR_O (outer) | GR_I (inner) | GR_I (inner) | GR_O (outer) | GR_O (outer) | GR_I (inner) | GR_I (inner) | GR_O (outer) |
| WLn | 5 | 1 | 3 | 7 | 6 | 2 | 4 | 8 |
| WLn-1 | 13 | 9 | 11 | 15 | 14 | 10 | 12 | 16 |
| ... | ... | ... | ... | ... | ... | ... | ... | ... |
| WL2 | A-11 | A-15 | A-13 | A-9 | A-10 | A-14 | A-12 | A-8 |
| WL1 | A-3 | A-7 | A-5 | A-1 | A-2 | A-6 | A-4 | A |

FIG. 11C

| B2T Normal Scramble - 8SSL | | | | | | | | |
|---|---|---|---|---|---|---|---|---|
| Physical WL | SSL1 | SSL2 | SSL3 | SSL4 | SSL5 | SSL6 | SSL7 | SSL8 |
| Inner/Outer | GR_O (outer) | GR_I (inner) | GR_I (inner) | GR_O (outer) | GR_O (outer) | GR_I (inner) | GR_I (inner) | GR_O (outer) |
| WLn | A-11 | A-15 | A-13 | A-9 | A-10 | A-14 | A-12 | A-8 |
| WLn-1 | A-3 | A-7 | A-5 | A-1 | A-2 | A-6 | A-4 | A |
| ... | ... | ... | ... | ... | ... | ... | ... | ... |
| WL2 | 13 | 9 | 11 | 15 | 14 | 10 | 12 | 16 |
| WL1 | 5 | 1 | 3 | 7 | 6 | 2 | 4 | 8 |

FIG. 12B

| T2B Normal Scramble - 8SSL | | | | | | | | |
|---|---|---|---|---|---|---|---|---|
| Physical WL | SSL1 | SSL2 | SSL3 | SSL4 | SSL5 | SSL6 | SSL7 | SSL8 |
| Inner/Outer | GR_O (outer) | GR_I (inner) | GR_I (inner) | GR_O (outer) | GR_O (outer) | GR_I (inner) | GR_I (inner) | GR_O (outer) |
| WLn | 5 | 1 | 3 | 6 | 7 | 2 | 4 | 8 |
| WLn-1 | 13 | 9 | 11 | 14 | 15 | 10 | 12 | 16 |
| ... | ... | ... | ... | ... | ... | ... | ... | ... |
| WL2 | A-11 | A-15 | A-13 | A-10 | A-9 | A-14 | A-12 | A-8 |
| WL1 | A-3 | A-7 | A-5 | A-2 | A-1 | A-6 | A-4 | A |

FIG. 12C

| B2T Normal Scramble - 8SSL | | | | | | | | |
|---|---|---|---|---|---|---|---|---|
| Physical WL | SSL1 | SSL2 | SSL3 | SSL4 | SSL5 | SSL6 | SSL7 | SSL8 |
| Inner/Outer | GR_O (outer) | GR_I (inner) | GR_I (inner) | GR_O (outer) | GR_O (outer) | GR_I (inner) | GR_I (inner) | GR_O (outer) |
| WLn | A-11 | A-15 | A-13 | A-10 | A-9 | A-14 | A-12 | A-8 |
| WLn-1 | A-3 | A-7 | A-5 | A-2 | A-1 | A-6 | A-4 | A |
| ... | ... | ... | ... | ... | ... | ... | ... | ... |
| WL2 | 13 | 9 | 11 | 14 | 15 | 10 | 12 | 16 |
| WL1 | 5 | 1 | 3 | 6 | 7 | 2 | 4 | 8 |

FIG. 13B

T2B Normal Scramble – 10SSL

| Physical WL | SSL1 | SSL2 | SSL3 | SSL4 | SSL5 | SSL6 | SSL7 | SSL8 | SSL9 | SSL10 |
|---|---|---|---|---|---|---|---|---|---|---|
| Inner/Outer | GR_O (outer) | GR_I2 (2nd inner) | GR_I1 (1st inner) | GR_I2 (2nd inner) | GR_O (outer) | GR_O (outer) | GR_I2 (2nd inner) | GR_I1 (1st inner) | GR_I2 (2nd inner) | GR_O (outer) |
| WLn | 7 | 3 | 1 | 5 | 9 | 8 | 4 | 2 | 6 | 10 |
| WLn-1 | 17 | 13 | 11 | 15 | 19 | 18 | 14 | 12 | 16 | 20 |
| ... | ... | ... | ... | ... | ... | ... | ... | ... | ... | ... |
| WL2 | A-13 | A-17 | A-19 | A-15 | A-11 | A-12 | A-16 | A-18 | A-14 | A-10 |
| WL1 | A-3 | A-7 | A-9 | A-5 | A-1 | A-2 | A-6 | A-8 | A-4 | A |

FIG. 13C

| B2T Normal Scramble – 10SSL | | | | | | | | | | |
|---|---|---|---|---|---|---|---|---|---|---|
| Physical WL | SSL1 | SSL2 | SSL3 | SSL4 | SSL5 | SSL6 | SSL7 | SSL8 | SSL9 | SSL10 |
| Inner/Outer | GR_O (outer) | GR_I2 (2nd inner) | GR_I1 (1st inner) | GR_I2 (2nd inner) | GR_O (outer) | GR_O (outer) | GR_I2 (2nd inner) | GR_I1 (1st inner) | GR_I2 (2nd inner) | GR_O (outer) |
| WLn | A-3 | A-7 | A-9 | A-5 | A-1 | A-2 | A-6 | A-8 | A-4 | A |
| WLn-1 | A-13 | A-17 | A-19 | A-15 | A-11 | A-12 | A-16 | A-18 | A-14 | A-10 |
| ... | ... | ... | ... | ... | ... | ... | ... | ... | ... | ... |
| WL2 | 17 | 13 | 11 | 15 | 19 | 18 | 14 | 12 | 16 | 20 |
| WL1 | 7 | 3 | 1 | 5 | 9 | 8 | 4 | 2 | 6 | 10 |

FIG. 14B

| T2B Normal Scramble - 10SSL | | | | | | | | | | |
|---|---|---|---|---|---|---|---|---|---|---|
| Physical WL | SSL1 | SSL2 | SSL3 | SSL4 | SSL5 | SSL6 | SSL7 | SSL8 | SSL9 | SSL10 |
| Inner/Outer | GR_O (outer) | GR_I2 (2nd inner) | GR_I1 (1st inner) | GR_I2 (2nd inner) | GR_O (outer) | GR_O (outer) | GR_I2 (2nd inner) | GR_I1 (1st inner) | GR_I2 (2nd inner) | GR_O (outer) |
| WLn | 7 | 3 | 1 | 4 | 8 | 9 | 5 | 2 | 6 | 10 |
| WLn-1 | 17 | 13 | 11 | 14 | 18 | 19 | 15 | 12 | 16 | 20 |
| ... | ... | ... | ... | ... | ... | ... | ... | ... | ... | ... |
| WL2 | A-13 | A-17 | A-19 | A-16 | A-12 | A-11 | A-15 | A-18 | A-14 | A-10 |
| WL1 | A-3 | A-7 | A-9 | A-6 | A-2 | A-1 | A-5 | A-8 | A-4 | A |

FIG. 14C

| B2T Normal Scramble - 10SSL | | | | | | | | | | |
|---|---|---|---|---|---|---|---|---|---|---|
| Physical WL | SSL1 | SSL2 | SSL3 | SSL4 | SSL5 | SSL6 | SSL7 | SSL8 | SSL9 | SSL10 |
| Inner/Outer | GR_O (outer) | GR_I2 (2nd inner) | GR_I1 (1st inner) | GR_I2 (2nd inner) | GR_O (outer) | GR_O (outer) | GR_I2 (2nd inner) | GR_I1 (1st inner) | GR_I2 (2nd inner) | GR_O (outer) |
| WLn | A-3 | A-7 | A-9 | A-6 | A-2 | A-1 | A-5 | A-8 | A-4 | A |
| WLn-1 | A-13 | A-17 | A-19 | A-16 | A-12 | A-11 | A-15 | A-18 | A-14 | A-10 |
| ... | ... | ... | ... | ... | ... | ... | ... | ... | ... | ... |
| WL2 | 17 | 13 | 11 | 14 | 18 | 19 | 15 | 12 | 16 | 20 |
| WL1 | 7 | 3 | 1 | 4 | 8 | 9 | 5 | 2 | 6 | 10 |

FIG. 15

| T2B Normal Scramble – 12SSL | | | | | | | | | | | | |
|---|---|---|---|---|---|---|---|---|---|---|---|---|
| Physical WL | SSL1 | SSL2 | SSL3 | SSL4 | SSL5 | SSL6 | SSL7 | SSL8 | SSL9 | SSL10 | SSL11 | SSL12 |
| Inner/Outer | GR_O (outer) | GR_I2 (2nd inner) | GR_I1 (1st inner) | GR_I1 (1st inner) | GR_I2 (2nd inner) | GR_O (outer) | GR_O (outer) | GR_O (outer) | GR_I1 (1st inner) | GR_I1 (1st inner) | GR_I2 (2nd inner) | GR_O (outer) |
| WLn | 9 | 5 | 1 | 3 | 7 | 10 | 11 | 6 | 2 | 4 | 8 | 12 |
| WLn-1 | 21 | 17 | 13 | 15 | 19 | 22 | 23 | 18 | 14 | 16 | 20 | 24 |
| WLn-2 | 33 | 29 | 25 | 27 | 31 | 34 | 35 | 30 | 26 | 28 | 32 | 36 |
| ... | ... | ... | ... | ... | ... | ... | ... | ... | ... | ... | ... | ... |

FIG. 16

| T2B Normal Scramble - 14SSL | | | | | | | | | | | | | | |
|---|---|---|---|---|---|---|---|---|---|---|---|---|---|---|
| Physical WL | SSL1 | SSL2 | SSL3 | SSL4 | SSL5 | SSL6 | SSL7 | SSL8 | SSL9 | SSL10 | SSL11 | SSL12 | SSL13 | SSL14 |
| Inner/Outer | GR_O (outer) | GR_I3 (3rd inner) | GR_I2 (2nd inner) | GR_I1 (1st inner) | GR_I2 (2nd inner) | GR_I3 (3rd inner) | GR_O (outer) | GR_O (outer) | GR_I3 (3rd inner) | GR_I2 (2nd inner) | GR_I1 (1st inner) | GR_I2 (2nd inner) | GR_I3 (3rd inner) | GR_O (outer) |
| WLn | 11 | 7 | 3 | 1 | 5 | 9 | 13 | 12 | 8 | 4 | 2 | 6 | 10 | 14 |
| WLn-1 | 25 | 21 | 17 | 15 | 19 | 23 | 27 | 26 | 22 | 18 | 16 | 20 | 24 | 28 |
| WLn-2 | 39 | 35 | 31 | 29 | 33 | 37 | 41 | 40 | 36 | 32 | 30 | 34 | 38 | 42 |
| ... | ... | ... | ... | ... | ... | ... | ... | ... | ... | ... | ... | ... | ... | ... |

NON-VOLATILE MEMORY DEVICE

CROSS-REFERENCE TO RELATED APPLICATIONS

This is a Continuation Application of U.S. application Ser. No. 17/742,879, filed on May 12, 2022, now U.S. Pat. No. 12,100,452 issued Sep. 24, 2024, which claims priority to Korean Patent Application No. 10-2021-0128945, filed on Sep. 29, 2021, in the Korean Intellectual Property Office, the disclosures of which are incorporated by reference herein in their entireties.

BACKGROUND

The present disclosure relates to a memory device, and more particularly, to a non-volatile memory device having a multi-hole structure.

Memory devices are used to store data, and may be classified into volatile memory devices and non-volatile memory devices. According to the continuous demand for increased capacity and reduced size of non-volatile memory devices, 3-dimensional memory devices including a plurality of channel holes, that is, a plurality of channel structures, which vertically extend on a substrate, have been developed. To improve the degree of integration of 3-dimensional memory devices, the number of channel holes, that is, channel structures, which are included in each memory block, may be increased. In the case of non-volatile memory devices having such increased channel holes, there may be differences in performance due to differences in intrinsic properties between channel holes, that is, channel structures.

SUMMARY

The present disclosure provides a non-volatile memory device capable of reducing differences in performance due to differences in intrinsic properties of channel holes by determining a program order considering the intrinsic properties of the channel holes.

According to an aspect of an example embodiment, a non-volatile memory device includes: a plurality of word lines stacked in a vertical direction on a substrate; a plurality of string select lines on the plurality of word lines, the plurality of string select lines being spaced apart from each other in a first horizontal direction and extending in a second horizontal direction, the first and second horizontal directions being parallel with a surface of the substrate, and the second horizontal direction being perpendicular to the first horizontal direction; and a memory cell array including a plurality of memory blocks, each of which includes a plurality of memory cells connected to the plurality of word lines and the plurality of string select lines. The plurality of string select lines includes a first string select line, and a second string select line which is farther from a word line cut region than the first string select line, and a program operation on second memory cells connected to a selected word line and the second string select line is performed before a program operation on first memory cells connected to the selected word line and the first string select line.

According to an aspect of an example embodiment, a non-volatile memory device includes: a memory cell array including a plurality of memory blocks, each of which includes a plurality of memory cells; a row decoder connected to the memory cell array via a plurality of word lines and a plurality of string select lines, the plurality of word lines being stacked in a vertical direction on a substrate, and the plurality of string select lines extending in a horizontal direction on the plurality of word lines; and a control logic circuit configured to, according to a program command and an address, generate a row address based on the address such that the plurality of memory cells are programmed in a random order that is different from a physical arrangement order of the plurality of string select lines. The row decoder is configured to sequentially apply a selection voltage to the plurality of string select lines and apply a program voltage to a selected word line from among the plurality of word lines, according to the row address.

According to yet an aspect of an example embodiment, a non-volatile memory device includes: a plurality of word lines stacked in a vertical direction on a substrate; a plurality of string select lines on the plurality of word lines, the plurality of string select lines being spaced apart from each other in a first horizontal direction and extending in a second horizontal direction, the first and second horizontal directions being parallel with a surface of the substrate, and the second horizontal direction being perpendicular to the first horizontal direction; and a memory cell array including a plurality of memory cells connected to the plurality of word lines and the plurality of string select lines. The plurality of string select lines includes first and second string select lines which are included in an inner channel hole group, and third and fourth string select lines which are included in an outer channel hole group that is closer to a word line cut region than the inner channel hole group. Program operations on memory cells connected to the first and second string select lines are sequentially performed, and subsequently, program operations on memory cells connected to the third and fourth string select lines are sequentially performed.

BRIEF DESCRIPTION OF THE DRAWINGS

The above and other aspects will be more clearly understood from the following description of embodiments, taken in conjunction with the accompanying drawings in which:

FIG. 9B illustrates one example of a program order regarding the memory device of FIG. 9A, and FIG. 9C illustrates another example of a program order regarding the memory device of FIG. 9A;

FIG. 10B illustrates one example of a program order regarding the memory device of FIG. 10A, and FIG. 10C illustrates another example of a program order regarding the memory device of FIG. 10A;

FIG. 11B illustrates one example of a program order regarding the memory device of FIG. 11A, and FIG. 11C illustrates another example of a program order regarding the memory device of FIG. 11A;

FIG. 12B illustrates one example of a program order regarding the memory device of FIG. 12A, and FIG. 12C illustrates another example of a program order regarding the memory device of FIG. 12A;

FIG. 13B illustrates one example of a program order regarding the memory device of FIG. 13A, and FIG. 13C illustrates another example of a program order regarding the memory device of FIG. 13A;

FIG. 14B illustrates one example of a program order regarding the memory device of FIG. 14A, and FIG. 14C illustrates another example of a program order regarding the memory device of FIG. 14A;

FIG. 15 illustrates an example of a program order of a memory device, according to an embodiment;

FIG. 16 illustrates an example of a program order of a memory device, according to an embodiment;

DETAILED DESCRIPTION

Figure 1:
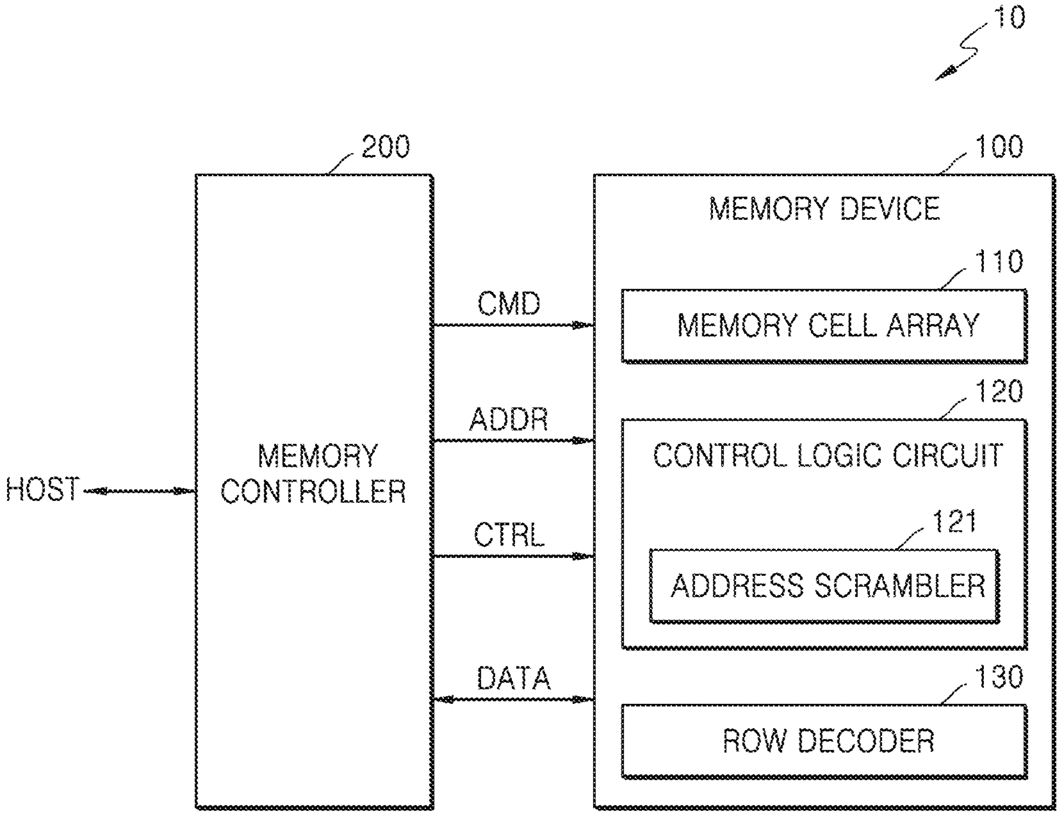
FIG. 1 is a block diagram illustrating a memory system according to an embodiment.

Hereinafter, embodiments will be described in detail with reference to the accompanying drawings. Like components are denoted by like reference numerals throughout the specification, and repeated descriptions thereof are omitted. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure.

FIG. 1 is a block diagram illustrating a memory system 10 according to an embodiment.

Referring to FIG. 1, the memory system 10 may include a memory device 100 and a memory controller 200, and the memory device 100 may include a memory cell array 110, a control logic circuit 120, and a row decoder 130. The memory device 100 may include a non-volatile memory device. In some embodiments, the memory system 10 may be implemented by internal memory, for example, an embedded Universal Flash Storage (UFS) memory device, an embedded Multi-Media Card (eMMC), or a Solid State Drive (SSD), which is embedded in an electronic device. In some embodiments, the memory system 10 may be implemented by external memory, for example, a UFS memory card, a Compact Flash (CF) card, a Secure Digital (SD) card, a Micro Secure Digital (Micro-SD) card, a Mini Secure Digital (Mini-SD) card, an extreme Digital (xD) card, or a Memory Stick, which is detachable from an electronic device.

The memory controller 200 may control the memory device 100 to read data stored in the memory device 100 or program data into the memory device 100, in response to a read/write request from a host HOST. Specifically, the memory controller 200 may control program, read, and erase operations on the memory device 100 by providing an address ADDR, a command CMD, and a control signal CTRL to the memory device 100. In addition, data DATA to be programmed and the read data DATA may be transmitted and received between the memory controller 200 and the memory device 100.

The memory cell array 110 may include a plurality of memory cells, for example, a plurality of flash memory cells. Hereinafter, embodiments will be described by taking examples in which the plurality of memory cells include NAND flash memory cells. However, embodiments are not limited thereto, and in some embodiments, the plurality of memory cells may include resistive memory cells such as resistive random access memory (ReRAM) cells, phase-change RAM (PRAM) cells, or magnetic RAM (MRAM) cells.

The control logic circuit 120 may receive the command CMD, the address ADDR, and the control signal CTRL from the memory controller 200, and may control overall operations of the memory device 100, based on the command CMD, the address ADDR, and the control signal CTRL, which are received. When the command CMD is a program command, the control logic circuit 120 may generate a row address from the address ADDR through an address scramble operation, in response to the program command, such that the plurality of memory cells are programmed in order that is different from a physical arrangement order of the plurality of memory cells.

In one embodiment, the control logic circuit 120 may include an address scrambler 121. The address scrambler 121 may perform address scrambling (i.e., the address scramble operation) such that programming is randomly performed on a plurality of pages corresponding to a word line selected according to the address ADDR. Specifically, the address scrambler 121 may determine a select order of a plurality of string select lines that is different from a physical arrangement order of the plurality of string select lines, and may generate a row address according to the determined select order of the plurality of string select lines.

The row decoder 130 may receive the row address from the control logic circuit 120, may sequentially apply a selection voltage to the plurality of string select lines according to the row address, and may apply a program voltage to a selected word line from among a plurality of word lines. For example, the row decoder 130 may apply the selection voltage to a second string select line (for example, SSL2 of FIG. 3), and then, may apply the selection voltage to a first string select line (for example, SSL1 of FIG. 3). Thus, memory cells connected to the second string select line may be programmed first, and then, memory cells connected to the first string select line may be programmed.

Although FIG. 1 illustrates the address scrambler 121 is shown as being included in the control logic circuit 120, embodiments are not limited thereto. In some embodiments, the address scrambler 121 may be included in an interface circuit of the memory device 100. In addition, in some embodiments, the address scrambler 121 may be included in the memory controller 200, and the memory controller 200 may generate the address ADDR by determining the select order of the plurality of string select lines that is different from the physical arrangement order of the plurality of string select lines, during a program operation on the selected word line.

Figure 2:
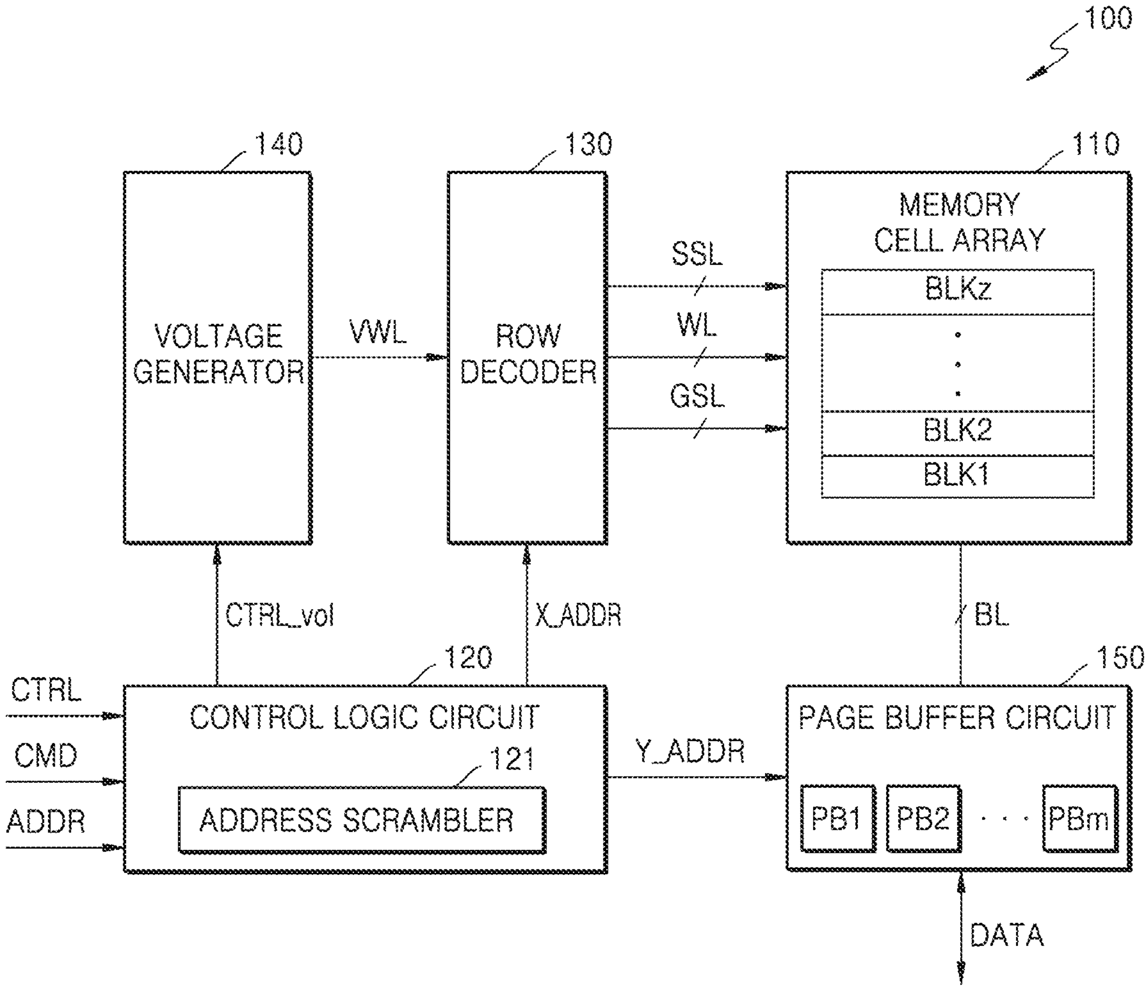
FIG. 2 is a block diagram illustrating a memory device according to an embodiment.

FIG. 2 is a block diagram illustrating the memory device 100 according to an embodiment.

Referring to FIG. 2, the memory device 100 may include the memory cell array 110, the control logic circuit 120, the row decoder 130, a voltage generator 140, and a page buffer circuit 150. The memory device 100 may further include an interface circuit, and the interface circuit may include a data input-output circuit, a command/address input-output circuit, and the like.

The memory cell array 110 may include a plurality of memory blocks BLK1 to BLKz, where z is a positive integer. Each of the plurality of memory blocks BLK1 to BLKz may include a plurality of pages, and each of the plurality of pages may include a plurality of memory cells. For example, a memory block may be a unit of erasure, and a page may be a unit of writing and reading. Each memory cell may store one or more bits, and for example, each memory cell may be used as a Single Level Cell (SLC), a Multi-Level Cell (MLC), a Triple Level Cell (TLC), or a Quadruple Level Cell (QLC). In one embodiment, some of the plurality of memory blocks BLK1 to BLKz may include SLC blocks, and the others may include MLC blocks, TLC blocks, or QLC blocks.

In addition, the memory cell array 110 may be connected to a plurality of word lines WL, a plurality of string select lines SSL, a plurality of ground select lines GSL, and a plurality of bit lines BL. The memory cell array 110 may be connected to the row decoder 130 via the plurality of word lines WL, the plurality of string select lines SSL, and the plurality of ground select lines GSL, and may be connected to the page buffer circuit 150 via the plurality of bit lines BL.

In one embodiment, the memory cell array 110 may include a 3-dimensional memory cell array, and the 3-dimensional memory cell array may include a plurality of NAND strings. Each NAND string may include memory cells respectively connected to word lines vertically stacked over a substrate. U.S. Pat. Nos. 7,679,133, 8,553,466, 8,654,587, US Publication No. 8,559,235, and US Patent Application Publication No. 2011/0233648 are incorporated by reference herein in their entireties. In one embodiment, the memory cell array 110 may include a 2-dimensional memory cell array, and the 2-dimensional memory cell array may include a plurality of NAND strings arranged in row and column directions.

The control logic circuit 120 may output various control signals for writing data to the memory cell array 110 or reading data from the memory cell array 110, based on the command CMD, the address ADDR, and the control signal CTRL, which are received from the memory controller 200. Thus, the control logic circuit 120 may take overall control of various operations in the memory device 100. Specifically, the control logic circuit 120 may provide a voltage control signal CTRL_vol to the voltage generator 140, may provide a row address X_ADDR to the row decoder 130, and may provide a column address Y_ADDR to the page buffer circuit 150. However, embodiments are not limited thereto, and the control logic circuit 120 may further provide other control signals to the voltage generator 140, the row decoder 130, and the page buffer circuit 150.

The voltage generator 140 may generate various voltages for performing program, read, and erase operations, based on the voltage control signal CTRL_vol. For example, the voltage generator 140 may generate, as a word line voltage VWL, a program voltage, a read voltage, a program-verify voltage, an erase voltage, and the like. For example, the voltage generator 140 may generate, as a string select line voltage, a selection voltage and a non-selection voltage.

The row decoder 130 may select one of the plurality of word lines WL in response to the row address X_ADDR, and may select one of the plurality of string select lines SSL. For example, during a program operation, the row decoder 130 may sequentially apply a program voltage and a program-verify voltage to the selected word line, and may apply a selection voltage to the selected string select line. For example, during a read operation, the row decoder 130 may apply a read voltage to the selected word line.

The page buffer circuit 150 may select one of the plurality of bit lines BL in response to the column address Y_ADDR. The page buffer circuit 150 may operate as a write driver or a sense amplifier according to an operation mode. The page buffer circuit 150 may include a plurality of page buffers PB1 to PBm, where m is a positive integer. For example, m may correspond to the number of bit lines, and the plurality of page buffers PB1 to PBm may be respectively connected to the plurality of bit lines BL. For example, the plurality of bit lines BL may be grouped into a plurality of bit line groups, and bit lines included in each of the plurality of bit line groups may share a page buffer.

Figure 3:
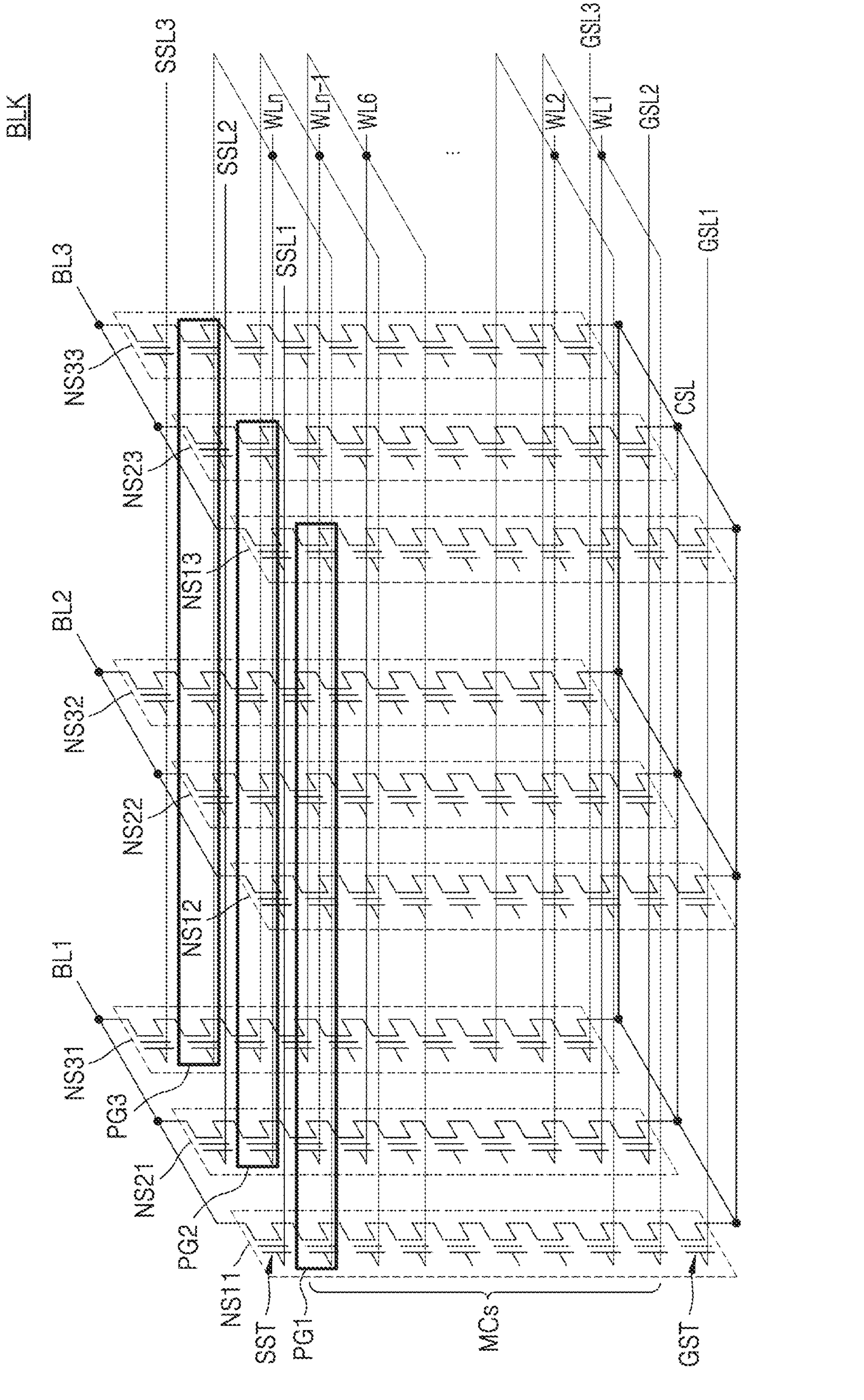
FIG. 3 is a circuit diagram illustrating a memory block according to an embodiment.

FIG. 3 is a circuit diagram illustrating a memory block BLK according to an embodiment.

Referring to FIG. 3, the memory block BLK may correspond to one of the plurality of memory blocks BLK1 to BLKz of FIG. 2. The memory block BLK may include NAND strings NS11 to NS33, and each NAND string (for example, NS11) may include a string select transistor SST, a plurality of memory cells MCs, and a ground select transistor GST, which are connected in series. The string select and ground select transistors SST and GST and the memory cells MCs, which are included in each NAND string, may form a structure stacked in a vertical direction over a substrate.

Bit lines BL1 to BL3 may extend in a first direction or a first horizontal direction, and word lines WL1 to WLn may extend in a second direction or a second horizontal direction, where n is a positive integer. The NAND strings NS11, NS21, and NS31 may be arranged between a first bit line BL1 and a common source line CSL, the NAND strings NS12, NS22, and NS32 may be arranged between a second bit line BL2 and the common source line CSL, and the NAND strings NS13, NS23, and NS33 may be arranged between a third bit line BL3 and the common source line CSL.

The string select transistors SST may be connected to a corresponding string select line SSL1, SSL2, or SSL3. The memory cells MCs may be respectively connected to the corresponding word lines WL1 to WLn. The ground select transistors GST may be connected to a corresponding ground select line GSL1, GSL2, or GSL3. The string select transistor SST may be connected to a corresponding bit line, and the ground select transistors GST may be connected to the common source line CSL. Here, the number of NAND strings, the number of word lines, the number of bit lines, the number of ground select lines, and the number of string select lines may vary according to embodiments.

Memory cells arranged at the same level may be connected to the same word line and may be grouped into first to third pages PG1, PG2, and PG3. For example, the first page PG1 may correspond to a first string select line SSL1, the second page PG2 may correspond to a second string select line SSL2, and the third page PG3 may correspond to a third string select line SSL3. Accordingly, when a program operation on the selected word line WLn is performed, the first to third string select lines SSL1, SSL2, and SSL3 may be randomly selected in an order different from a physical arrangement order thereof. Accordingly, the first to third pages PG1, PG2, and PG3 may be programmed in an order that is different from a physical arrangement order thereof.

For example, the second string select line SSL2, the first string select line SSL1, and the third string select line SSL3 may be selected in the stated order, and accordingly, a program operation may be sequentially performed on the second page PG2, the first page PG1, and the third page PG3 in the stated order. For example, the second string select line SSL2, the third string select line SSL3, and the first string select line SSL1 may be sequentially selected in the stated order, and accordingly, a program operation may be sequentially performed on the second page PG2, the third page PG3, and the first page PG1 in the stated order. However, embodiments are not limited thereto, and the selection may be sequentially performed in a different order, for example an order of the first string select line SSL1, the second string select line SSL2, and the third string select line SSL3 or in an order of the third string select line SSL3, the second string select line SSL2, and the first string select line SSL1.

Figure 4A:
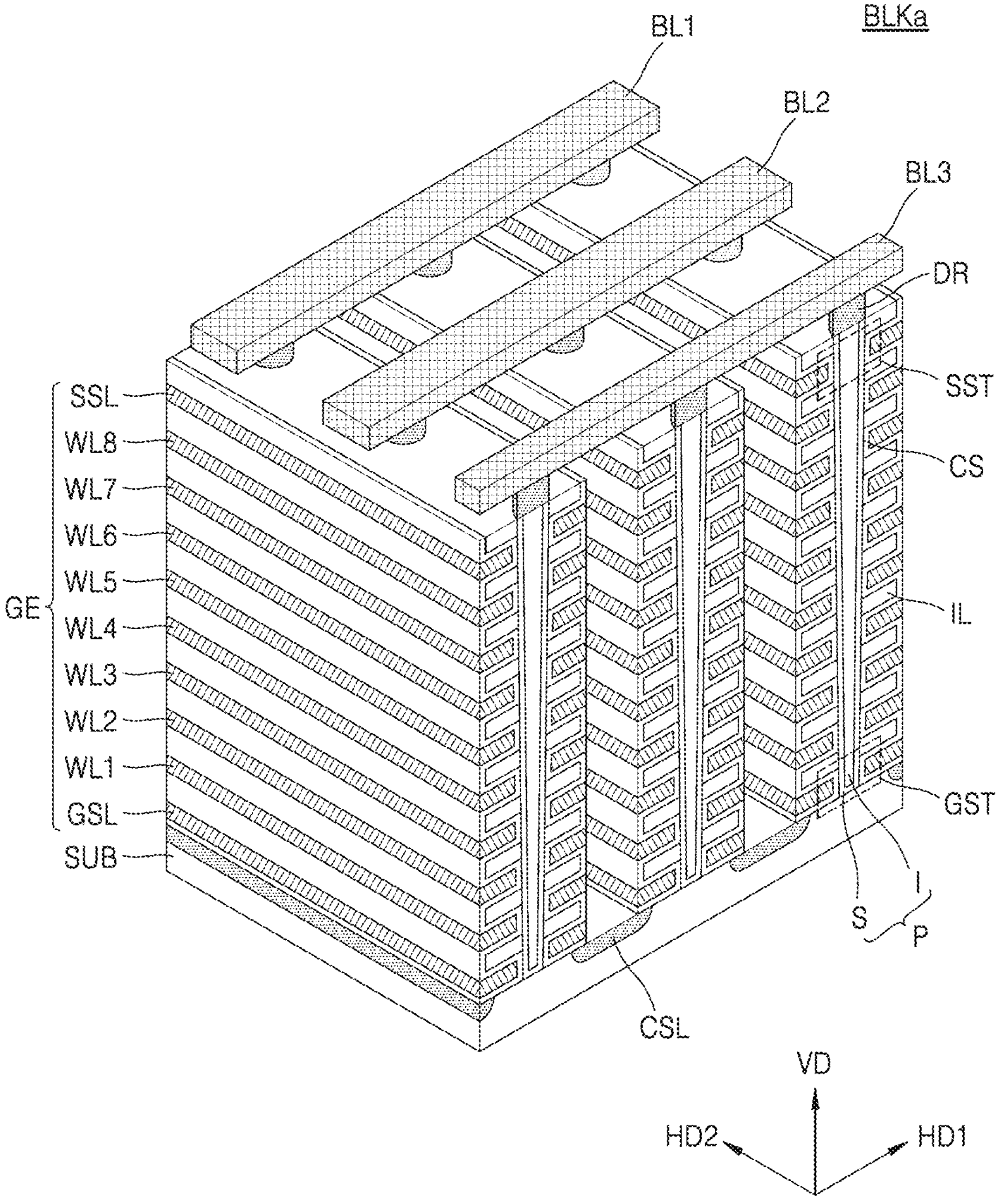
FIG. 4A is a perspective view illustrating a memory block according to an embodiment.

FIG. 4A is a perspective view illustrating a memory block BLKa according to an embodiment.

Referring to FIG. 4A, the memory block BLKa may correspond to one of the plurality of memory blocks BLK1 to BLKz of FIG. 2. The memory block BLKa is formed in a vertical direction VD with respect to a substrate SUB. The substrate SUB is of a first conductivity type (for example, a p-type), and the common source line CSL extends in a second horizontal direction HD2 over the substrate SUB. In one embodiment, the common source line CSL, which is doped with impurities of a second conductivity type (for example, an n-type), may be provided in the substrate SUB. In one embodiment, the substrate SUB may be implemented by polysilicon, and the plate-shaped common source line CSL may be arranged on the substrate SUB. A plurality of insulating layers IL, which extend in the second horizontal direction HD2, are provided sequentially in the vertical direction VD on the substrate SUB, and the plurality of insulating layers IL are spaced apart from each other by as much as a certain distance in the vertical direction VD. For example, the plurality of insulating layers IL may include an insulating material such as silicon oxide.

A plurality of pillars P, which are arranged sequentially in a first horizontal direction HD1, are provided on the substrate SUB to penetrate the plurality of insulating layers IL in the vertical direction VD. For example, the plurality of pillars P may contact the substrate SUB through the plurality of insulating layers IL. Specifically, a surface layer S of each pillar P may include a silicon material of a first conductivity type and may function as a channel region. Accordingly, in some embodiments, the pillar P may be referred to as a channel structure or a vertical channel structure. An inner layer I of each pillar P may include an insulating material such as silicon oxide or include an air gap.

A charge storage layer CS is provided along exposed surfaces of the insulating layers IL, the pillars P, and the substrate SUB. The charge storage layer CS may include a gate insulating layer (alternatively referred to as a "tunneling insulating layer"), a charge trap layer, and a blocking insulating layer. For example, the charge storage layer CS may have an oxide-nitride-oxide (ONO) structure. In addition, a gate electrode GE, such as the ground select line GSL, the string select line SSL, and the word lines WL1 to WL8, is provided on an exposed surface of the charge storage layer CS.

Drain contacts or drains DR are respectively provided on the plurality of pillars P. For example, the drains DR may each include a silicon material doped with impurities of a second conductivity type. The bit lines BL1 to BL3 are provided on the drains DR to extend in the first horizontal direction HD1 and be arranged apart from each other by as much as a certain distance in the second horizontal direction HD2.

Figure 4B:
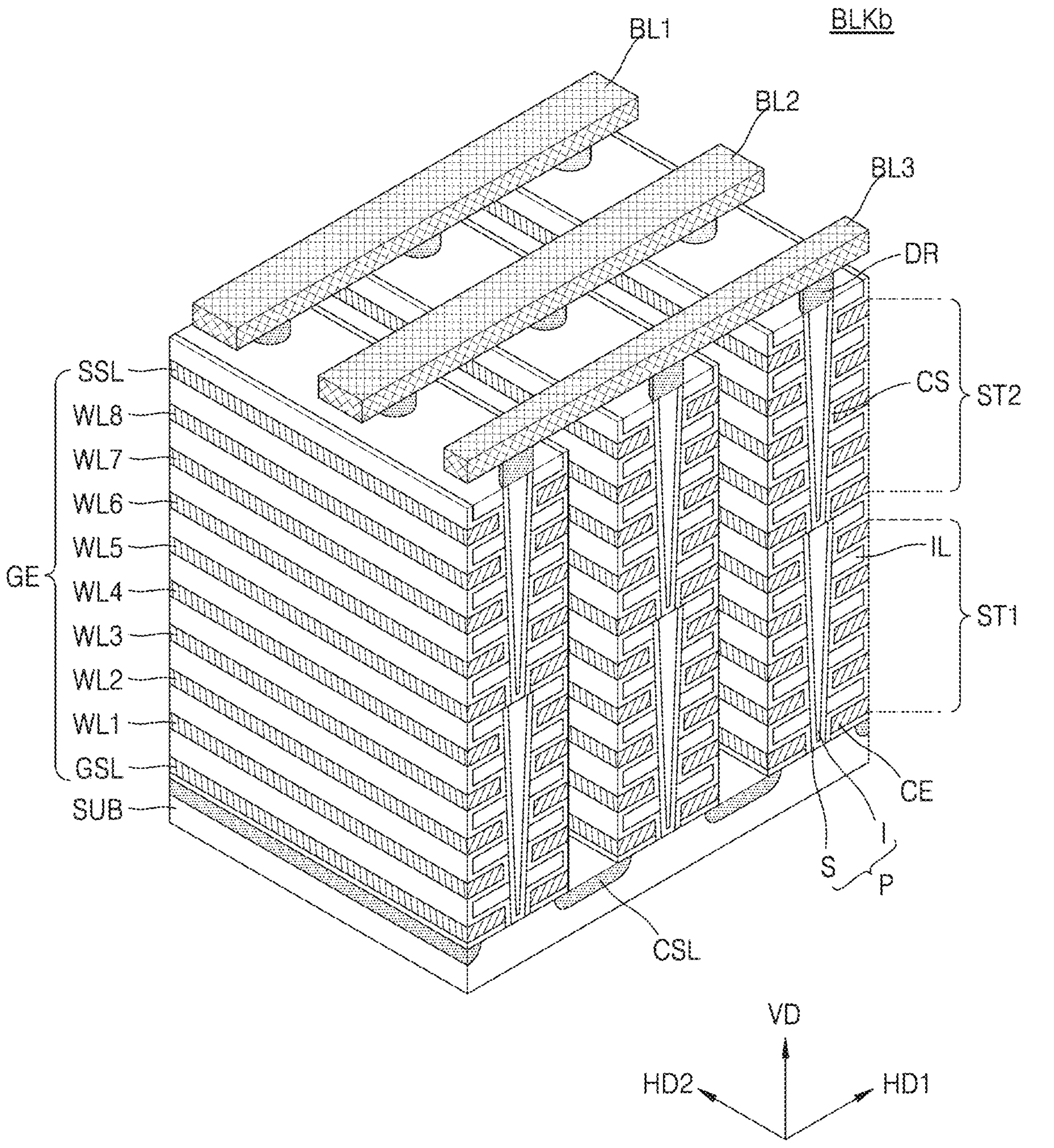
FIG. 4B is a perspective view illustrating a memory block according to an embodiment.

FIG. 4B is a perspective view illustrating a memory block BLKb according to an embodiment.

Referring to FIG. 4B, the memory block BLKb may correspond to one of the plurality of memory blocks BLK1 to BLKz of FIG. 2. In addition, the memory block BLKb corresponds to a modified example of the memory block BLKa of FIG. 4A, and the descriptions made above with reference to FIG. 4A may also be applied to the present embodiment. The memory block BLKb is formed in a vertical direction with respect to the substrate SUB. The memory block BLKb may include a first memory stack ST1 and a second memory stack ST2, both stacked in the vertical direction VD. However, embodiments are not limited thereto, and the memory block BLKb may include three or more memory stacks.

Figure 5:
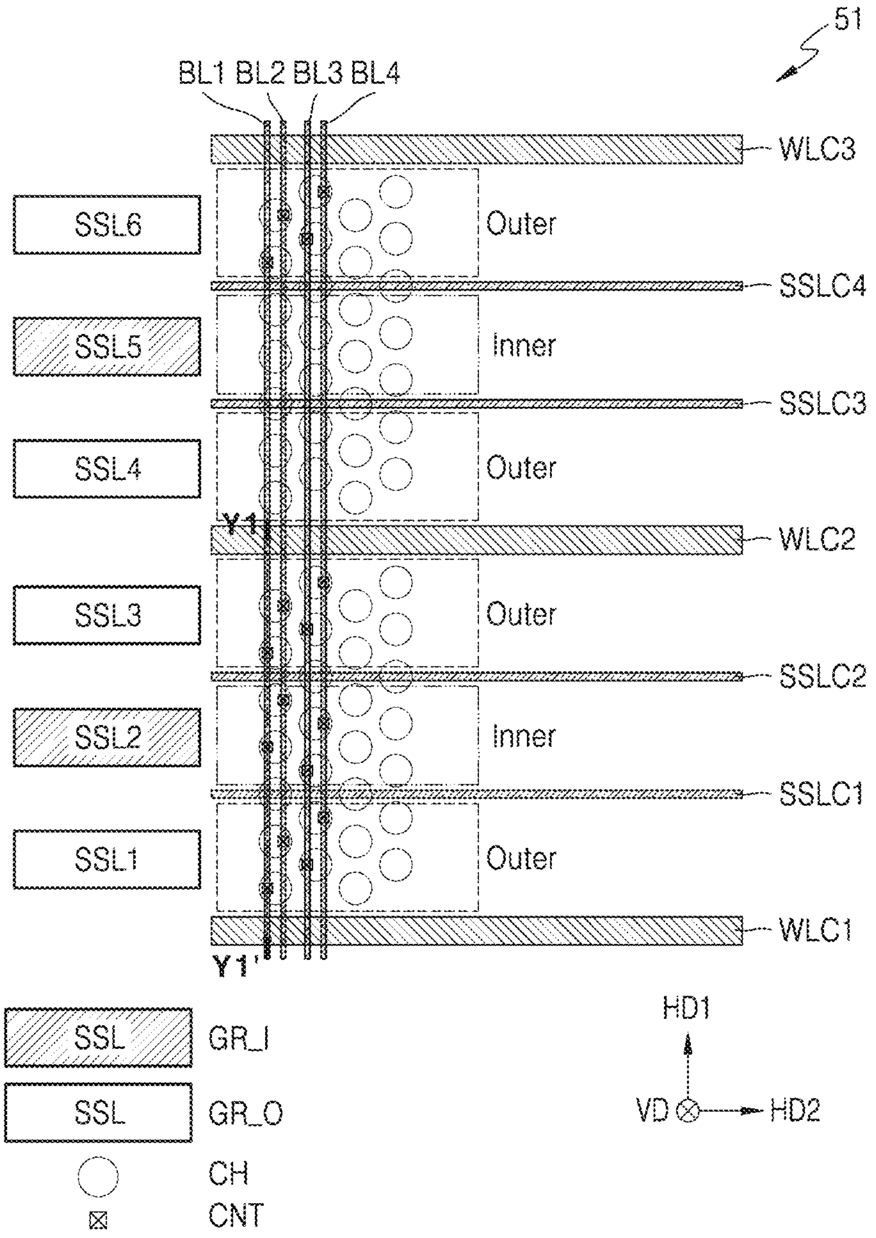
FIG. 5 is a plan view illustrating a memory device according to an embodiment.

FIG. 5 is a plan view illustrating a memory device 51 according to an embodiment.

Referring to FIG. 5, the memory device 51 may include first to third word line cut regions WLC1, WLC2, and WLC3, which are spaced apart from each other in the first horizontal direction HD1 and extend in the second horizontal direction HD2. According to some embodiments, the first to third word line cut regions WLC1, WLC2, and WLC3 may be referred to as first to third word line structures. For example, each memory block may be arranged in an area defined by three adjacent word line cut regions, that is, the first to third word line cut regions WLC1, WLC2, and WLC3. However, embodiments are not limited thereto, and each memory block may be arranged in an area defined by two word line cut regions. In addition, each memory block may be arranged in an area defined by four or more word line cut regions.

An identical word line may be divided into a first area, which is defined by the first and second word line cut regions WLC1 and WLC2, and a second area, which is defined by the second and third word line cut regions WLC2 and WLC3. According to some embodiments, each of the first and second areas may be referred to as a word line bar. Accordingly, each memory block may include two word line bars. However, embodiments are not limited thereto, and each memory block may include one word line bar. In addition, each memory block may include three or more word line bars.

The memory device 51 may further include first and second string select line cut regions SSLC1 and SSLC2 between the first and second word line cut regions WLC1 and WLC2, and third and fourth string select line cut regions SSLC3 and SSLC4 between the second and third word line cut regions WLC2 and WLC3. The first to fourth string select line cut regions SSLC1 to SSLC4 may be spaced apart from each other in the first horizontal direction HD1 and may extend in the second horizontal direction HD2. According to some embodiments, the first to fourth string select line cut regions SSLC1 to SSLC4 may be referred to as first to fourth string select line cut structures.

First to sixth string select lines SSL1 to SSL6 may be respectively arranged in areas defined by the first to third word line cut regions WLC1, WLC2, and WLC3 and the first to fourth string select line cut regions SSLC1 to SSLC4. Specifically, the first string select line SSL1 may be arranged between the first word line cut region WLC1 and the first string select line cut region SSLC1, the second string select line SSL2 may be arranged between the first and second string select line cut regions SSLC1 and SSLC2, and the third string select line SSL3 may be arranged between the second string select line cut region SSLC2 and the second word line cut region WLC2. In addition, the fourth string select line SSL4 may be arranged between the second word line cut region WLC2 and the third string select line cut region SSLC3, the fifth string select line SSL5 may be arranged between the third and fourth string select line cut regions SSLC3 and SSLC4, and the sixth string select line SSL6 may be arranged between the fourth string select line cut region SSLC4 and the third word line cut region WLC3.

The memory device 51 may further include a plurality of channel holes CH, a plurality of contacts CNT, and first to fourth bit lines BL1 to BL4. The first to fourth bit lines BL1 to BL4 may extend in the first horizontal direction HD1 and may be spaced apart from each other in the second horizontal direction HD2. Some channel holes from among the plurality of channel holes CH may be connected to one of the first to fourth bit lines BL1 to BL4 via the corresponding contacts CNT. In addition, the contacts CNT may not be formed on all channel holes, and for example may not be formed on dummy holes, from among the plurality of channel holes CH, and the dummy holes may not be connected to the first to fourth bit lines BL1 to BL4. For example, although the plurality of channel holes CH may be arranged in a honeycomb structure, embodiments are not limited thereto. As such, a structure, in which each memory block includes the plurality of channel holes CH, may be referred to as a "multi-hole structure".

The plurality of channel holes CH may be classified into inner channel holes and outer channel holes, according to distances thereof from a word line cut region adjacent thereto. The channel holes CH corresponding to the second string select line SSL2 may be classified into the inner channel holes due to relatively large distances thereof from the first word line cut region WLC1 or the second word line cut region WLC2, and the channel holes CH corresponding to the fifth string select line SSL5 may be classified into the inner channel holes due to relatively large distances thereof from the second word line cut region WLC2 or the third word line cut region WLC3. Accordingly, the second and fifth string select lines SSL2 and SSL5 may be included in a first hole group, for example an inner channel hole group GR_I.

On the other hand, the channel holes CH corresponding to the first string select line SSL1 may be classified into the outer channel holes due to relatively small distances thereof from the first word line cut region WLC1, the channel holes CH corresponding to the third and fourth string select lines SSL3 and SSL4 may be classified into the outer channel holes due to relatively small distances thereof from the second word line cut region WLC2, and the channel holes CH corresponding to the sixth string select line SSL6 may be classified into the outer channel holes due to relatively small distances from the third word line cut region WLC3. Accordingly, the first, third, fourth, and sixth string select lines SSL1, SSL3, SSL4, and SSL6 may be included in a second hole group, for example an outer channel hole group GR_O.

Figure 6:
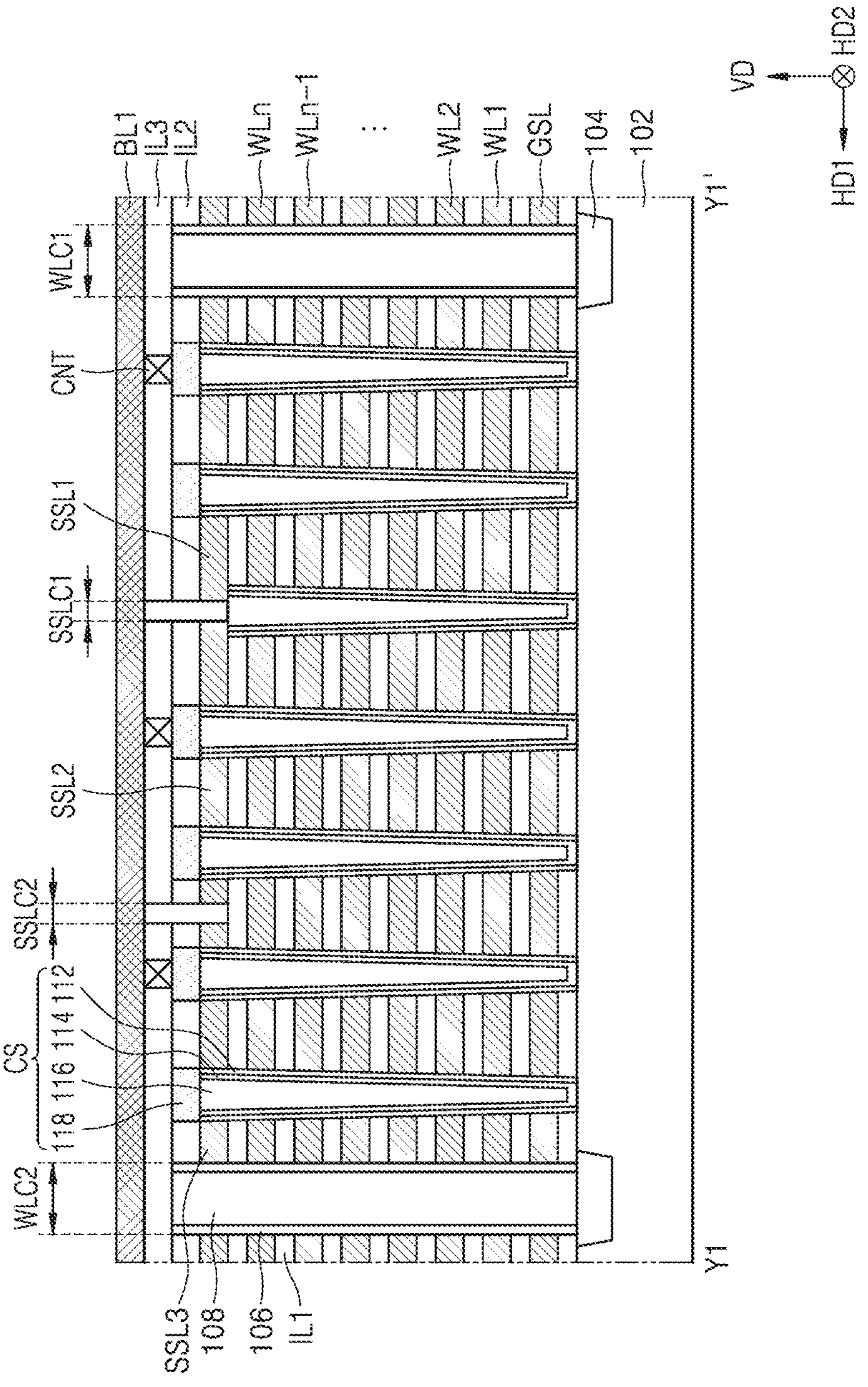
FIG. 6 is a cross-sectional view taken along a line Y1-Y1' of FIG. 5, according to an embodiment.

FIG. 6 is a cross-sectional view taken along a line Y1-Y1' of FIG. 5, according to an embodiment.

Referring together to FIGS. 5 and 6, a substrate 102 may have a main surface extending in the first horizontal direction HD1 and the second horizontal direction HD2. In an example embodiment, the substrate 102 may include Si, Ge, or SiGe. In another example embodiment, the substrate 102 may include a silicon-on-insulator (SOI) substrate or a germanium-on-insulator (GeOI) substrate. Common source regions 104 may extend in the second horizontal direction HD2 in the substrate 102. The common source regions 104 may function as source regions providing currents to memory cells. In one embodiment, the common source regions 104 may include impurity regions doped with n-type impurities at a high concentration. However, embodiments are not limited thereto, and in some embodiments, the common source regions 104 may include doped polysilicon regions.

The first and second word line cut regions WLC1 and WLC2 may extend in the second horizontal direction HD2, which is parallel to the main surface of the substrate 102. The first and second word line cut regions WLC1 and WLC2 may define a width of each of the plurality of word lines WL1 to WLn in the first horizontal direction HD1. The plurality of word lines WL1 to WLn may be repeatedly arranged and spaced apart from each other along the vertical direction VD, at regular intervals, between the first and second word line cut regions WLC1 and WLC2.

An insulating spacer 106 and a common source line 108 may be formed in each of the first and second word line cut regions WLC1 and WLC2. Each common source line 108 may extend in the second horizontal direction HD2 on the corresponding common source region 104. However, embodiments are not limited thereto, and in some embodiments, each of the first and second word line cut regions WLC1 and WLC2 may include an insulating structure and thus may also be referred to as a word line cut structure. In example embodiments, the insulating structure may include silicon oxide, silicon nitride, silicon oxynitride, or a low-k material. For example, the insulating structure may include a silicon oxide layer, a silicon nitride layer, a SiON layer, a SiOCN layer, a SiCN layer, or a combination thereof. In other example embodiments, at least a portion of the insulating structure may include an air gap. As used herein, the term "air" refers to the atmosphere, or other gases that may be present during a manufacturing process.

The ground select line GSL and the plurality of word lines WL1 to WLn may be sequentially stacked, in the stated order, between the first and second word line cut regions WLC1 and WLC2. The plurality of word lines WL1 to WLn may extend, over the substrate 102, in a horizontal direction parallel to the main surface of the substrate 102, and may be arranged apart from each other to overlap each other in the vertical direction VD that is perpendicular to the main surface of the substrate 102. As such, the plurality of word lines WL1 to WLn may be stacked in the vertical direction VD over the substrate 102.

The first to third string select lines SSL1, SSL2, and SSL3 may be arranged over the plurality of word lines WL1 to WLn. The first to third string select lines SSL1, SSL2, and SSL3 may be separated and spaced apart from each other by the first and second string select line cut regions SSLC1 and SSLC2. For example, the first and second string select line cut regions SSLC1 and SSLC2 may be filled with an insulating layer. The insulating layer may include an oxide layer, a nitride layer, or a combination thereof. At least a portion of each of the first and second string select line cut regions SSLC1 and SSLC2 may be filled with an air gap.

Each of the ground select line GSL, the plurality of word lines WL1 to WLn, and the first to third string select lines SSL1, SSL2, and SSL3 may include a metal, a metal silicide, an impurity-doped semiconductor, or a combination thereof. For example, each of the ground select line GSL, the plurality of word lines WL1 to WLn, and the first to third string select lines SSL1, SSL2, and SSL3 may include a metal such as tungsten, nickel, cobalt, or tantalum, a metal silicide such as tungsten silicide, nickel silicide, cobalt silicide, or tantalum silicide, impurity-doped polysilicon, or a combination thereof. An insulating layer IL1 may be arranged between the substrate 102 and the ground select line GSL, and between the ground select line GSL, the plurality of word lines WL1 to WLn, and the first to third string select lines SSL1, SSL2, and SSL3. The insulating layer IL1 may include silicon oxide, silicon nitride, or silicon oxynitride.

The plurality of channel structures CS may extend in the vertical direction VD through the ground select line GSL, the plurality of word lines WL1 to WLn, one of the first to third string select lines SSL1, SSL2, and SSL3, and a plurality of insulating layers IL1. The plurality of channel structures CS may respectively correspond to the plurality of channel holes CH of FIG. 5. The plurality of channel structures CS may be arranged apart from each other at certain intervals in the first horizontal direction HD1 and the second horizontal direction HD2.

Each of the plurality of channel structures CS may include a gate dielectric layer 112, a channel region 114, a buried insulating layer 116, and a drain region 118. In an example embodiment, a barrier metal layer may be formed between the gate dielectric layer 112 and the ground select line GSL, between the gate dielectric layer 112 and the plurality of word lines WL1 to WLn, and between the gate dielectric layer 112 and the corresponding string select line SSL1, SSL2, or SSL3. The channel region 114 may include doped polysilicon and/or undoped polysilicon. The channel region 114 may have a cylindrical shape.

An inner space of the channel region 114 may be filled with the buried insulating layer 116. The buried insulating layer 116 may include an insulating material. For example, the buried insulating layer 116 may include silicon oxide, silicon nitride, silicon oxynitride, or a combination thereof. In an example embodiment, the buried insulating layer 116 may be omitted, and in this case, the channel region 114 may have a pillar structure with no inner space. The drain region 118 may include an impurity-doped polysilicon layer. A plurality of drain regions 118 may be insulated from each other by an insulating layer IL2. The insulating layer IL2 may include an oxide layer, a nitride layer, or a combination thereof. Each drain region 118 may be connected to one corresponding first bit line BL1 from among a plurality of bit lines (for example, BL of FIG. 2) via the plurality of contacts CNT. The plurality of contacts CNT may be insulated from each other by an insulating layer IL3.

In a manufacturing process of the memory device 51, a plurality of insulating layers IL1 and a plurality of sacrificial insulating layers may be alternately stacked one by one on the substrate 102. For example, the plurality of insulating layers IL1 may each include a silicon oxide layer, and the plurality of sacrificial insulating layers may each include a silicon nitride layer. Here, the plurality of sacrificial insulating layers may secure a space for forming a plurality of gate lines that include the ground select line GSL, the plurality of word lines WL1 to WLn, and the first to third string select lines SSL1, SSL2, and SSL3, in a subsequent process. Next, the plurality of channel structures CS may be formed through the plurality of insulating layers IL1 and the plurality of sacrificial insulating layers. Next, the plurality of sacrificial insulating layers may be substituted with the plurality of gate lines through word line cut holes respectively corresponding to the first and second word line cut regions WLC1 and WLC2. Next, the word line cut holes may be filled with the insulating spacer 106 and the common source line 108.

Here, a thickness of each of the plurality of gate lines, which substitute for the plurality of sacrificial insulating layers, in the vertical direction VD may vary according to a distance thereof from a word line cut region adjacent thereto. For example, in a gate line at the same level, a region thereof relatively close to the first or second word line cut region WLC1 or WLC2 may be thicker in the vertical direction VD than a region thereof relatively far from the first or second word line cut region WLC1 or WLC2. Accordingly, in the vertical direction VD, a thickness of a word line, which is connected to inner memory cells formed in inner channel holes, may be less than a thickness of a word line, which is connected to outer memory cells formed in outer channel holes. As a result, a program rate, that is, a program speed for the inner memory cells formed in the inner channel holes may be lower than a program rate for the outer memory cells formed in the outer channel holes.

Figure 7:
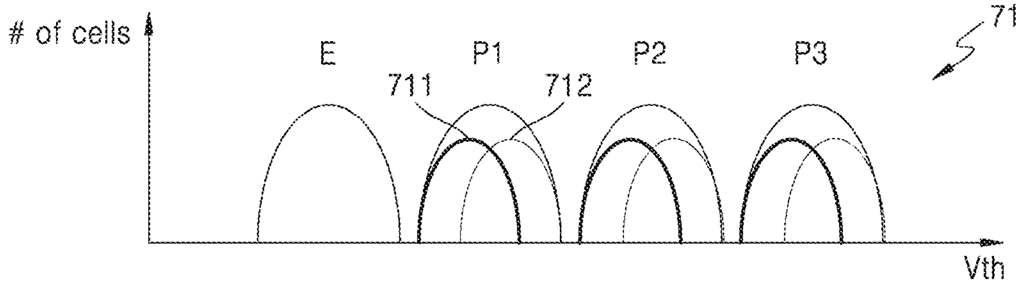
FIG. 7 is a graph depicting a dispersion of memory cells, according to an embodiment.

FIG. 7 is a graph depicting a distribution 71 of memory cells, according to an embodiment.

Referring together to FIGS. 6 and 7, in the distribution 71 of the memory cells, the horizontal axis represents a threshold voltage (Vth), and the vertical axis represents the number of memory cells. For example, when a memory cell is an MLC that is programmed in a 2-bit manner, the memory cell may be in one of an erase state E and first to third program states P1 to P3. Here, a distribution 711 of inner memory cells formed in inner channel holes may be different from a distribution 712 of outer memory cells formed in outer channel holes.

Because a program rate for the inner memory cells is lower than a program rate for the outer memory cells, a threshold voltage of the inner memory cells may be lower than a threshold voltage of the outer memory cells, in the same program state. Due to the distribution 711 of the inner memory cells and the distribution 712 of the outer memory cells as described above, there may be a difference in program performance and read performance.

In one embodiment, a program order may be determined based on a distance between the memory cells and the adjacent word line cut region. Specifically, the inner memory cells, which are relatively far from the adjacent word line region, may be programmed first, and the outer memory cells, which are relatively close to the adjacent word line region, may be programmed later, thereby reducing a difference in program performance due to a difference in intrinsic properties between the memory cells. This will be described in detail with reference to FIGS. 8 to 16.

However, embodiments are not limited to the determination of the program order, and in some embodiments, a program start voltage, a program-verify voltage, the maximum number of program loops, an applying time of a program voltage, a read voltage, a start time point of a program-verify operation, a start time point of pass/fail determination, and the like may be determined based on the distance between the memory cells and the adjacent word line cut region. For example, a program start voltage for the inner memory cells, which are relatively far from the adjacent word line region, may be determined to be higher than a program start voltage for the outer memory cells, which are relatively close to the adjacent word line region, thereby reducing the difference in program performance due to the difference in intrinsic properties between the memory cells. For example, the maximum number of program loops for the inner memory cells, which are relatively far from the adjacent word line region, may be determined to be greater than the maximum number of program loops for the outer memory cells, which are relatively close to the adjacent word line region, thereby reducing the difference in program performance due to the difference in intrinsic properties between the memory cells.

Figure 8:
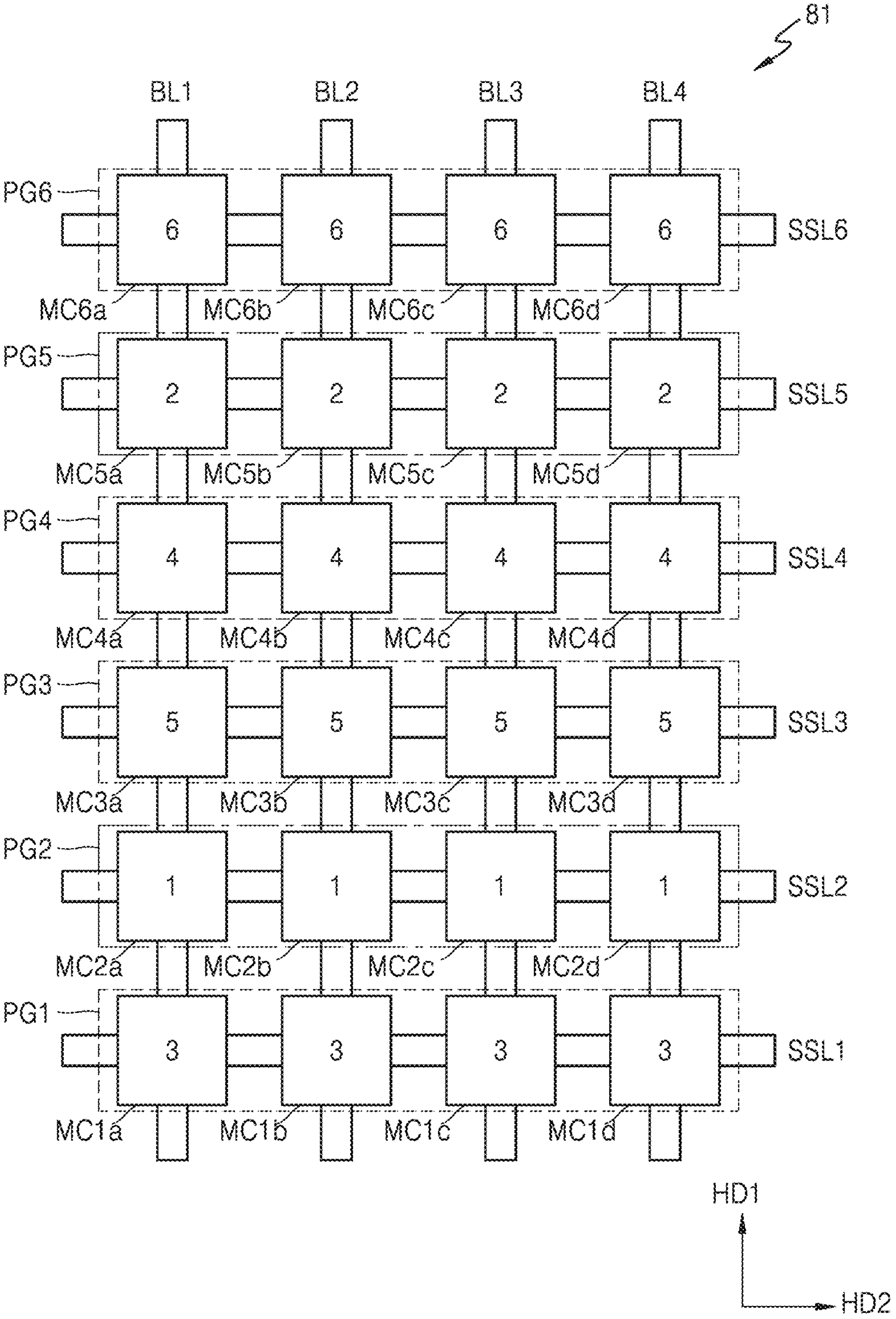
FIG. 8 illustrates an example of a program order regarding a memory block included in the memory device of FIG. 5.

FIG. 8 illustrates an example of a program order with respect to a memory block 81 included in the memory device 51 of FIG. 5.

Referring together to FIGS. 5 and 8, the memory block 81 may include first to sixth pages PG1 to PG6 corresponding to a selected word line, and the first to sixth pages PG1 to PG6 may be respectively connected to the first to sixth string select lines SSL1 to SSL6. Each of the first to sixth pages PG1 to PG6 may include memory cells respectively connected to the first to fourth bit lines BL1 to BL4. For example, the first page PG1 may include first memory cells MC1*a* to MC1*d* respectively connected to the first to fourth bit lines BL1 to BL4.

The second and fifth pages PG2 and PG5 may correspond to inner channel holes, which are relatively far from an adjacent word line cut region, and thus, a program rate, that is, a program speed for second memory cells MC2*a* to MC2*d* included in the second page PG2 and fifth memory cells MC5*a* to MC5*d* included in the fifth page PG5 may be relatively low. As such, memory cells having a relatively low program speed may be relatively insensitive to program disturbances due to a program operation on adjacent memory cells, after the completion of programming thereof.

On the other hand, the first, third, fourth, and sixth pages PG1, PG3, PG4, and PG6 may correspond to outer channel holes, which are relatively close to the adjacent word line cut region, and thus, a program speed for the first memory cells MC1*a* to MC1*d* included in the first page PG1, third memory cells MC3*a* to MC3*d* included in the third page PG3, fourth memory cells MC4*a* to MC4*d* included in the fourth page PG4, and sixth memory cells MC6*a* to MC6*d* included in the sixth page PG6 may be relatively high. As such, memory cells having a relatively high program speed may be relatively sensitive to program disturbances due to a program operation on adjacent memory cells, after the completion of programming thereof.

According to the present embodiment, the second and fifth pages PG2 and PG5 corresponding to the inner channel holes may be grouped into the first group (i.e., the inner channel hole group GR_I), the first, third, fourth, and sixth pages PG1, PG3, PG4, and PG6 corresponding to the outer channel holes may be grouped into the second group (i.e., the outer channel hole group GR_O), a program operation may be performed first on the inner channel hole group GR_I, and then, a program operation may be performed on the outer channel hole group GR_O. In addition, program operations on the second and fifth pages PG2 and PG5 included in the inner channel hole group GR_I may be consecutively performed, and program operations on the first, third, fourth, and sixth pages PG1, PG3, PG4, and PG6 included in the outer channel hole group GR_O may be consecutively performed after the program operations on the second and fifth pages PG2 and PG5 included in the inner channel hole group GR_I.

For example, a program operation on the second page PG2 may be performed, a program operation on the fifth page PG5 may be performed next, a program operation on the first page PG1 may be performed next, a program operation on the fourth page PG4 may be performed next, a program operation on the third page PG3 may be performed next, and then, a program operation on the sixth page PG6 may be performed. As such, the inner memory cells relatively insensitive to program disturbances may be programmed first, and the outer memory cells relatively sensitive to program disturbances may be programmed later. In this way, the program disturbances with respect to the outer memory cells having a high program speed may be reduced.

In addition, program operations on pages included in the same channel hole group may be consecutively performed, thereby allowing previous program information to be used for a next program operation. When the program operations on the second and fifth pages PG2 and PG5 included in the inner channel hole group GR_I are consecutively performed, program information of the second page PG2 may be used for the program operation on the fifth page PG5. For example, when the number of pass loops for each program state of the second page PG2 is greater than the number of reference loops, a program-verify start loop may be delayed during the program operation on the fifth page PG5. For example, a program start voltage level for the fifth page PG5 may be adjusted based on the number of pass loops for each program state of the second page PG2. In this way, a difference in performance due to a difference in intrinsic properties between the same channel holes may be reduced.

Figure 9A:
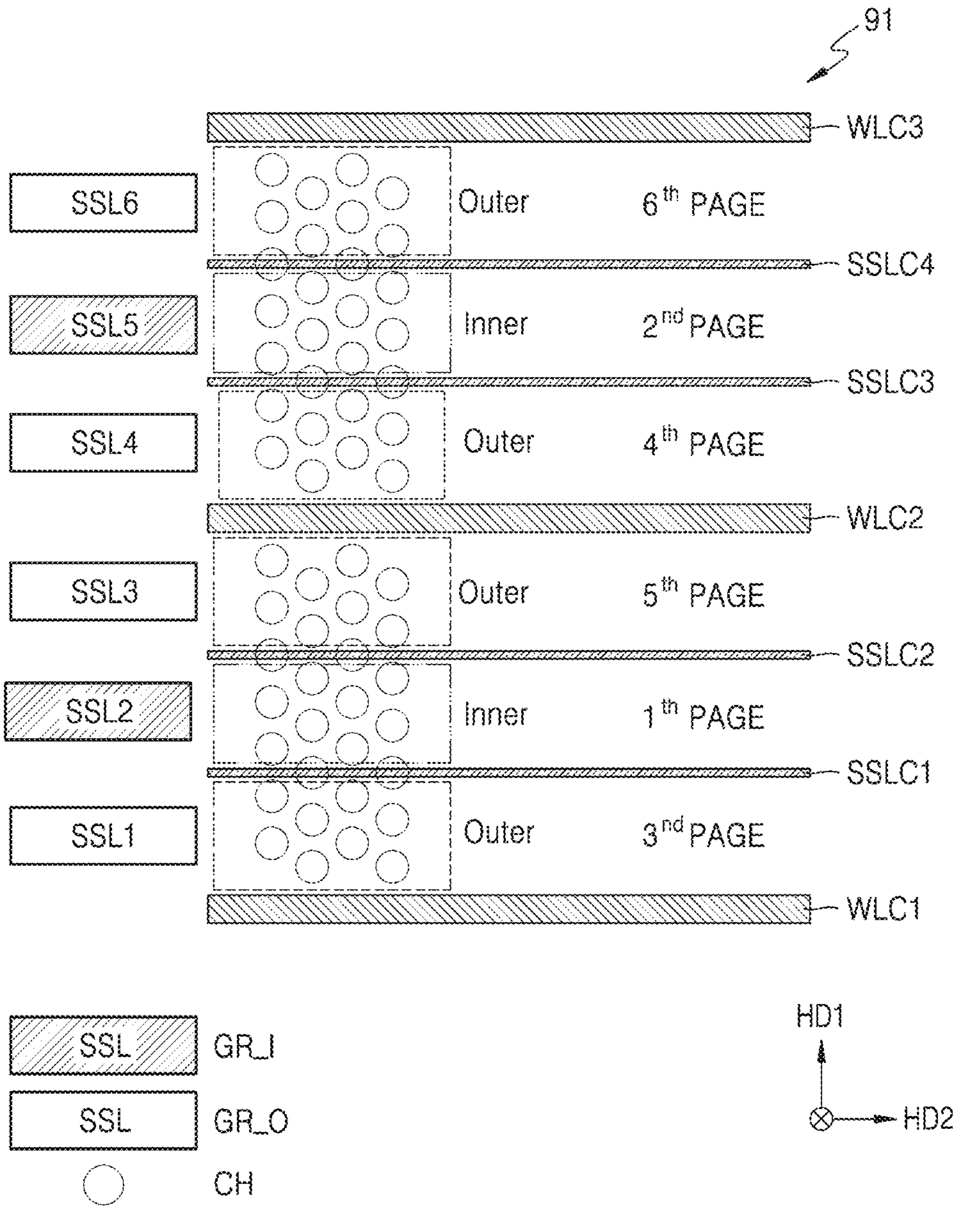
FIG. 9A is a plan view illustrating a memory device according to an embodiment.

FIG. 9A is a plan view illustrating a memory device 91 according to an embodiment.

Referring to FIG. 9A, the memory device 91 may have a 6SSL structure in which each memory block includes six string select lines. Here, each memory block may include a plurality of pages defined by the first to third word line cut regions WLC1 to WLC3 and the first to fourth string select line cut regions SSLC1 to SSLC4. Here, channel holes corresponding to the second and fifth string select lines SSL2 and SSL5 may be included in the inner channel hole group GR_I, and channel holes corresponding to the first, third, fourth, and sixth string select lines SSL1, SSL3, SSL4, and SSL6 may be included in the outer channel hole group GR_O. According to the present embodiment, the plurality of pages connected to a selected word line may be programmed in an order of the second string select line SSL2, the fifth string select line SSL5, the first string select line SSL1, the fourth string select line SSL4, the third string select line SSL3, and the sixth string select line SSL6.

FIG. 9B illustrates one example of a program order with respect to the memory device 91 of FIG. 9A.

Referring to FIG. 9B, when a program operation is performed on the plurality of word lines WL1 to WLn in a top-to-bottom (T2B) manner, the word line WLn arranged at the highest level may be programmed first, and subsequently, the word line WLn−1 arranged under the word line WLn may be programmed. Here, a program order of a plurality of pages included in each word line may be determined through normal scramble such that the plurality of pages are programmed in an order different from a physical arrangement order of the string select lines. Program operation for the word line WLn may be performed in an order of the second, fifth, first, fourth, third, and sixth string select lines SSL2, SSL5, SSL1, SSL4, SSL3, and SSL6, and subsequently, program operations for the word line WLn- may be performed in an order of the second, fifth, first, fourth, third, and sixth string select lines SSL2, SSL5, SSL1, SSL4, SSL3, and SSL6. As such, the program operations may be performed from top to bottom according to a stacked order of the word lines, and, program operations for the word line WL1 arranged at the lowest level may be performed last in an order of the second, fifth, first, fourth, third, and sixth string select lines SSL2, SSL5, SSL1, SSL4, SSL3, and SSL6. Accordingly, an order of programming memory cells connected to the word line WL1 and the sixth string select line SSL6 may be determined to be last.

FIG. 9C illustrates another example of a program order with respect to the memory device 91 of FIG. 9A.

Referring to FIG. 9C, when a program operation is performed on the plurality of word lines WL1 to WLn in a bottom-to-top (B2T) manner, the word line WL1 arranged at the lowest level may be programmed first, and subsequently, the word line WL2 arranged over the word line WL1 may be programmed. Here, the program order of the plurality of pages included in each word line may be determined through normal scramble such that the plurality of pages are programmed in an order different from the physical arrangement order of the string select lines. Program operations for the word line WL1 may be performed in an order of the second, fifth, first, fourth, third, and sixth string select lines SSL2, SSL5, SSL1, SSL4, SSL3, and SSL6, and subsequently, program operations for the word line WL2 may be performed in an order of the second, fifth, first, fourth, third, and sixth string select lines SSL2, SSL5, SSL1, SSL4, SSL3, and SSL6. As such, the program operations may be performed from bottom to top according to the stacked order of the word lines, and program operations for the word line WLn arranged at the highest level may be performed last in an order of the second, fifth, first, fourth, third, and sixth string select lines SSL2, SSL5, SSL1, SSL4, SSL3, and SSL6. Accordingly, an order of programming memory cells connected to the word line WLn and the sixth string select line SSL6 may be determined to be last.

For example, as shown in FIG. 4B, a memory block may have a 2-stack structure including the first memory stack ST1 and the second memory stack ST2. In one embodiment, a program operation may be performed on the first memory stack ST1 in the T2B manner as shown in FIG. 9B, and then, a program operation may be performed on the second memory stack ST2 in the T2B manner as shown in FIG. 9B. In one embodiment, a program operation may be performed on the first memory stack ST1 in the B2T manner as shown in FIG. 9C, and then, a program operation may be performed on the second memory stack ST2 in the B2T manner as shown in FIG. 9C. In one embodiment, a program operation may be performed on the second memory stack ST2 in the T2B manner as shown in FIG. 9B, and then, a program operation may be performed on the first memory stack ST1 in the T2B manner as shown in FIG. 9B. In one embodiment, a program operation may be performed on the second memory stack ST2 in the B2T manner as shown in FIG. 9C, and then, a program operation may be performed on the first memory stack ST1 in the B2T manner as shown in FIG. 9C. However, embodiments are not limited thereto, and a program operation may be performed on the first memory stack ST1 in the T2B manner, and a program operation may be performed on the second memory stack ST2 in the B2T manner, or vice versa.

Figure 10A:
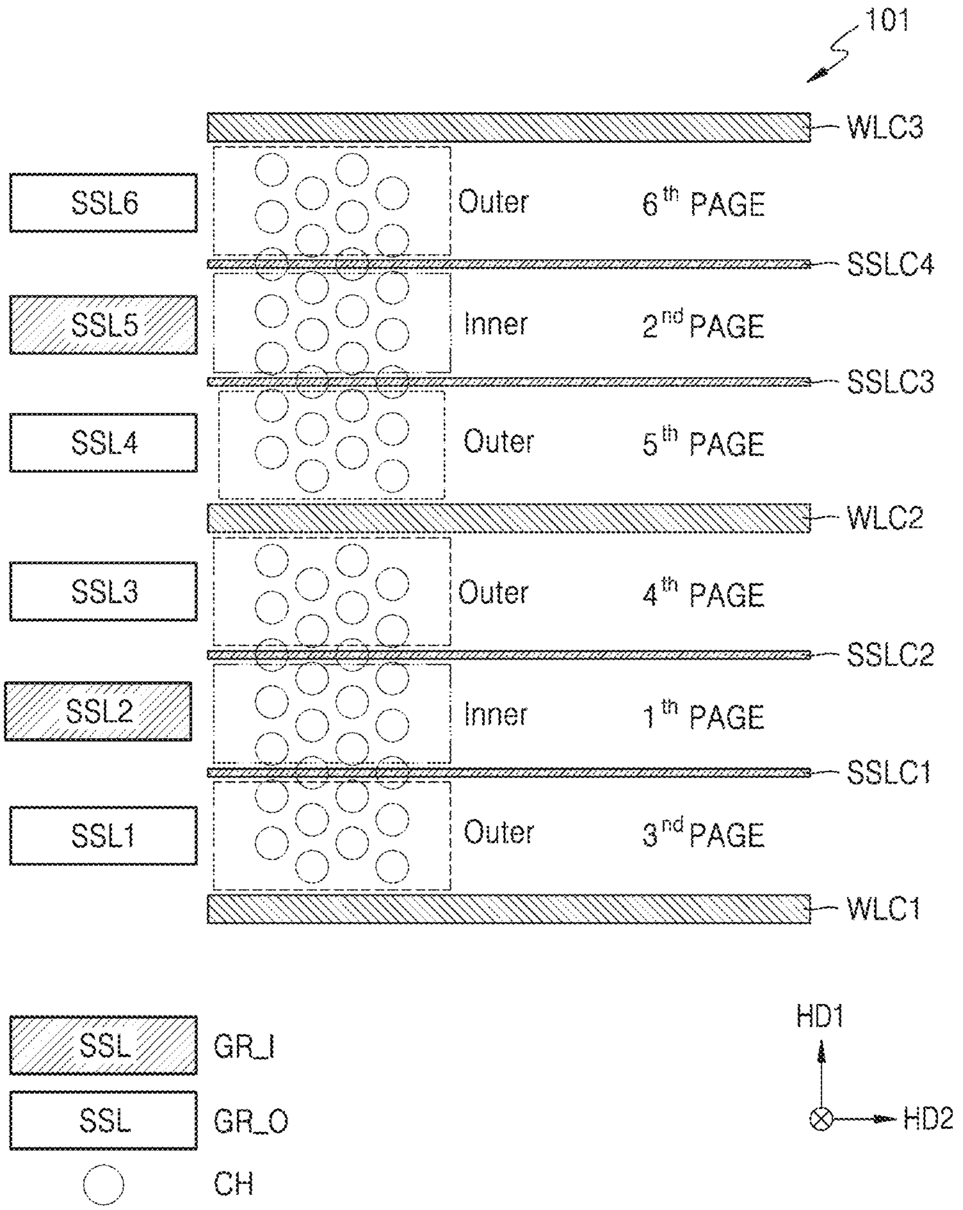
FIG. 10A is a plan view illustrating a memory device according to an embodiment.

FIG. 10A is a plan view illustrating a memory device 101 according to an embodiment.

Referring to FIG. 10A, the memory device 101 may correspond to a modified example of the memory device 91 of FIG. 9A, and the descriptions made above with reference to FIG. 9A may also be applied to the present embodiment. According to the present embodiment, the plurality of pages connected to the selected word line may be programmed in an order of the second string select line SSL2, the fifth string select line SSL5, the first string select line SSL1, the third string select line SSL3, the fourth string select line SSL4, and the sixth string select line SSL6.

FIG. 10B illustrates one example of a program order with respect to the memory device 101 of FIG. 10A.

Referring to FIG. 10B, when a program operation is performed on the plurality of word lines WL1 to WLn in the T2B manner, the word line WLn arranged at the highest level may be programmed first, and subsequently, the word line WLn-1 arranged under the word line WLn may be programmed. Here, a program order of the plurality of pages included in each word line may be determined through normal scramble such that the plurality of pages are programmed in an order different from a physical arrangement order of the string select lines. Program operations for the word line WLn may be performed in an order of the second, fifth, first, third, fourth, and sixth string select lines SSL2, SSL5, SSL1, SSL3, SSL4, and SSL6, and subsequently, program operations for the word line WLn−1 may be performed in an order of the second, fifth, first, third, fourth, and sixth string select lines SSL2, SSL5, SSL1, SSL3, SSL4, and SSL6. As such, the program operations may be performed from top to bottom according to a stacked order of the word lines, and program operations for the word line WL1 arranged at the lowest level may be performed last in an order of the second, fifth, first, third, fourth, and sixth string select lines SSL2, SSL5, SSL1, SSL3, SSL4, and SSL6. Accordingly, an order of programming memory cells connected to the word line WL1 and the sixth string select line SSL6 may be determined to be last.

FIG. 10C illustrates another example of a program order with respect to the memory device 101 of FIG. 10A.

Referring to FIG. 10C, when a program operation is performed on the plurality of word lines WL1 to WLn in the B2T manner, the word line WL1 arranged at the lowest level may be programmed first, and subsequently, the word line WL2 arranged over the word line WL1 may be programmed. Here, the program order of the plurality of pages included in each word line may be determined through normal scramble such that the plurality of pages are programmed in an order different from the physical arrangement order of the string select lines. Program operations for the word line WL1 may be performed in an order of the second, fifth, first, third, fourth, and sixth string select lines SSL2, SSL5, SSL1, SSL3, SSL4, and SSL6, and subsequently, program operations for the word line WL2 may be performed in an order of the second, fifth, first, third, fourth, and sixth string select lines SSL2, SSL5, SSL1, SSL3, SSL4, and SSL6. As such, the program operations may be performed from bottom to top according to the stacked order of the word lines, and program operations for the word line WLn arranged at the highest level may be performed last in an order of the second, fifth, first, third, fourth, and sixth string select lines SSL2, SSL5, SSL1, SSL3, SSL4, and SSL6. Accordingly, an order of programming memory cells connected to the word line WLn and the sixth string select line SSL6 may be determined to be last.

Figure 11A:
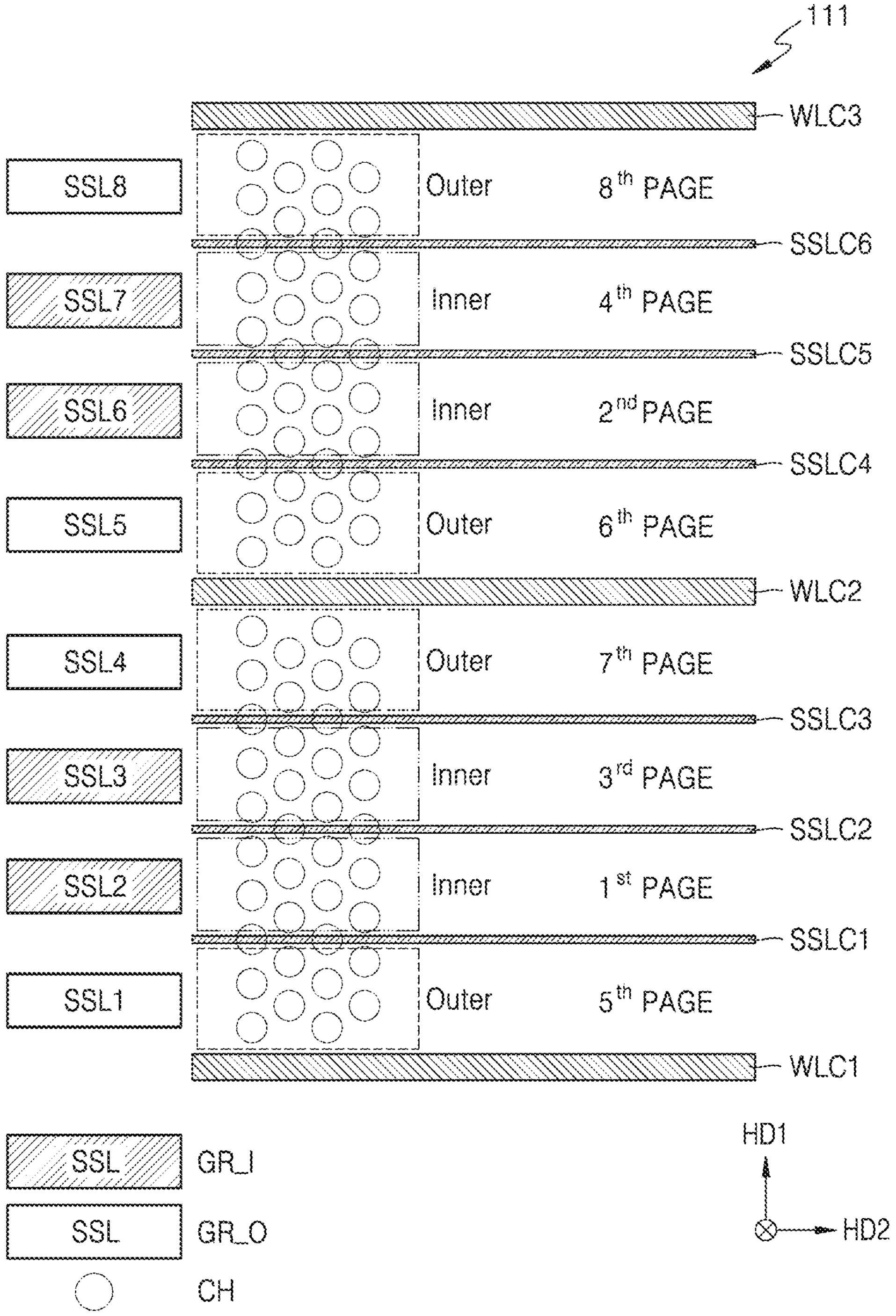
FIG. 11A is a plan view illustrating a memory device according to an embodiment.

FIG. 11A is a plan view illustrating a memory device 111 according to an embodiment.

Referring to FIG. 11A, the memory device 111 may have an 8SSL structure in which each memory block includes eight string select lines. Here, each memory block may include a plurality of pages defined by the first to third word line cut regions WLC1 to WLC3 and first to sixth string select line cut regions SSLC1 to SSLC6. Here, channel holes corresponding to the second, third, sixth, and seventh string select lines SSL2, SSL3, SSL6, and SSL7 may be included in the inner channel hole group GR_I, and channel holes corresponding to the first, fourth, fifth, and eighth string select lines SSL1, SSL4, SSL5, and SSL8 may be included in the outer channel hole group GR_O. According to the present embodiment, the plurality of pages connected to the selected word line may be programmed in an order of the second string select line SSL2, the sixth string select line SSL6, the third string select line SSL3, the seventh string select line SSL7, the first string select line SSL1, the fifth string select line SSL5, the fourth string select line SSL4, and the eighth string select line SSL8.

FIG. 11B illustrates one example of a program order with respect to the memory device 111 of FIG. 11A.

Referring to FIG. 11B, when a program operation is performed on the plurality of word lines WL1 to WLn in the T2B manner, the word line WLn arranged at the highest level may be programmed first, and subsequently, the word line WLn-1 arranged under the word line WLn may be programmed. Here, a program order of the plurality of pages included in each word line may be determined through normal scramble such that the plurality of pages are programmed in an order different from a physical arrangement order of the string select lines. Program operations for the word line WLn may be performed in an order of the second, sixth, third, seventh, first, fifth, fourth, and eighth string select lines SSL2, SSL6, SSL3, SSL7, SSL1, SSL5, SSL4, and SSL8, and subsequently, program operations for the word line WLn-1 may be performed in an order of the second, sixth, third, seventh, first, fifth, fourth, and eighth string select lines SSL2, SSL6, SSL3, SSL7, SSL1, SSL5, SSL4, and SSL8. As such, the program operations may be performed from top to bottom according to a stacked order of the word lines, and program operations for the word line WL1 arranged at the lowest level may be performed last in an order of the second, sixth, third, seventh, first, fifth, fourth, and eighth string select lines SSL2, SSL6, SSL3, SSL7, SSL1, SSL5, SSL4, and SSL8. Accordingly, an order of programming memory cells connected to the word line WL1 and the eighth string select line SSL8 may be determined to be last.

FIG. 11C illustrates another example of a program order with respect to the memory device 111 of FIG. 11A.

Referring to FIG. 11C, when a program operation is performed on the plurality of word lines WL1 to WLn in the B2T manner, the word line WL1 arranged at the lowest level may be programmed first, and subsequently, the word line WL2 arranged over the word line WL1 may be programmed. Here, the program order of the plurality of pages included in each word line may be determined through normal scramble such that the plurality of pages are programmed in an order different from the physical arrangement order of the string select lines. Program operations for the word line WL1 may be performed in an order of the second, sixth, third, seventh, first, fifth, fourth, and eighth string select lines SSL2, SSL6, SSL3, SSL7, SSL1, SSL5, SSL4, and SSL8, and subsequently, program operations for the word line WL2 may be performed in an order of the second, sixth, third, seventh, first, fifth, fourth, and eighth string select lines SSL2, SSL6, SSL3, SSL7, SSL1, SSL5, SSL4, and SSL8. As such, the program operations may be programmed from bottom to top according to the stacked order of the word lines, and program operations for the word line WLn arranged at the highest level may be performed last in an order of the second, sixth, third, seventh, first, fifth, fourth, and eighth string select lines SSL2, SSL6, SSL3, SSL7, SSL1, SSL5, SSL4, and SSL8. Accordingly, an order of programming memory cells connected to the word line WLn and the eighth string select line SSL8 may be determined to be last.

Figure 12A:
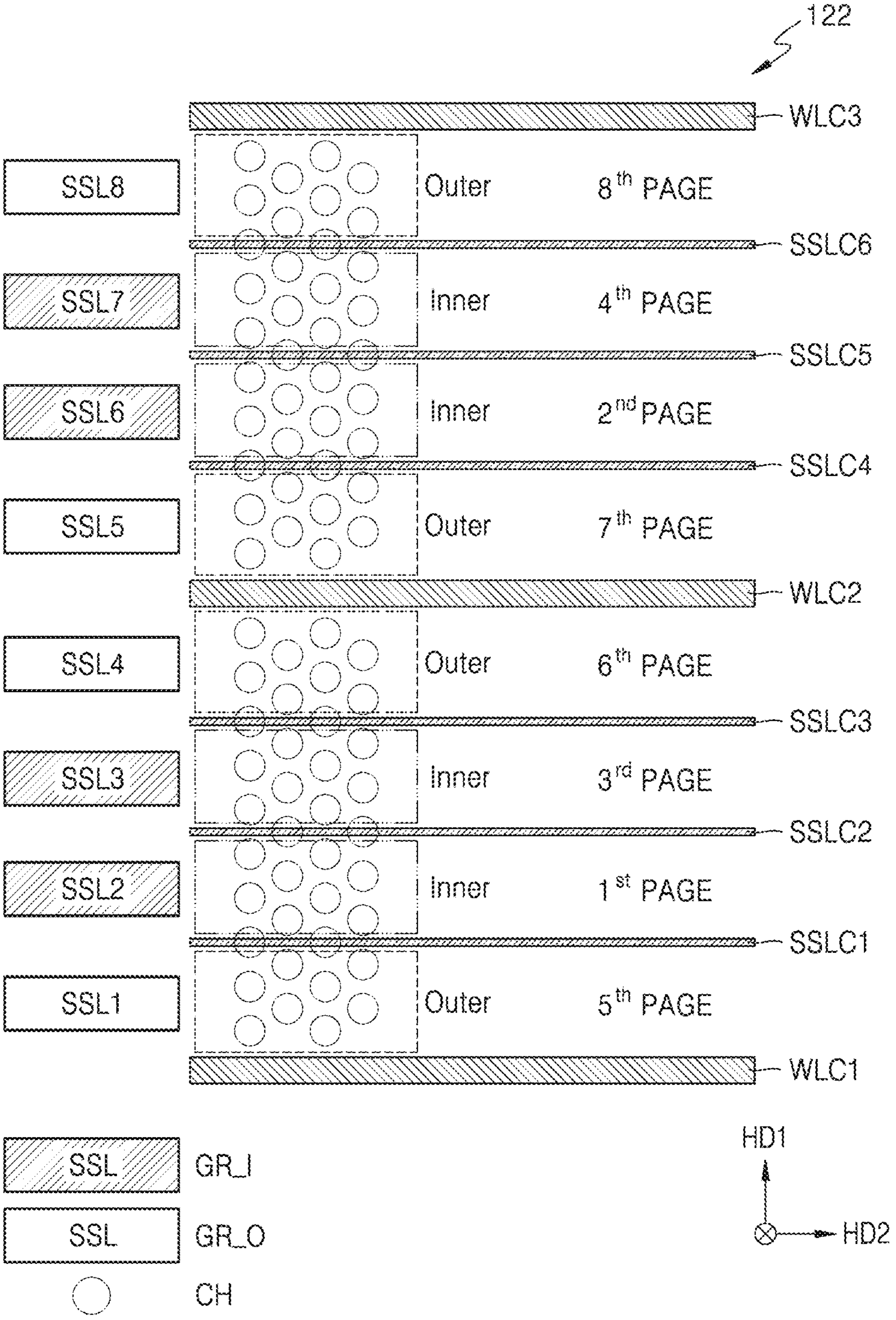
FIG. 12A is a plan view illustrating a memory device according to an embodiment.

FIG. 12A is a plan view illustrating a memory device 122 according to an embodiment.

Referring to FIG. 12A, the memory device 122 may correspond to a modified example of the memory device 111 of FIG. 11A, and the descriptions made above with reference to FIG. 11A may also be applied to the present embodiment. According to the present embodiment, the plurality of pages connected to the selected word line may be programmed in an order of the second string select line SSL2, the sixth string select line SSL6, the third string select line SSL3, the seventh string select line SSL7, the first string select line SSL1, the fourth string select line SSL4, the fifth string select line SSL5, and the eighth string select line SSL8.

FIG. 12B illustrates one example of a program order with respect to the memory device 122 of FIG. 12A.

Referring to FIG. 12B, when a program operation is performed on the plurality of word lines WL1 to WLn in the T2B manner, the word line WLn arranged at the highest level may be programmed first, and subsequently, the word line WLn−1 arranged under the word line WLn may be programmed. Here, the program order of the plurality of pages included in each word line may be determined through normal scramble such that the plurality of pages are programmed in an order different from the physical arrangement order of the string select lines. Program operations for the word line WLn may be performed in an order of the second, sixth, third, seventh, first, fourth, fifth, and eighth string select lines SSL2, SSL6, SSL3, SSL7, SSL1, SSL4, SSL5, and SSL8, and subsequently, program operations for the word line WLn-1 may be performed in an order of the second, sixth, third, seventh, first, fourth, fifth, and eighth string select lines SSL2, SSL6, SSL3, SSL7, SSL1, SSL4, SSL5, and SSL8. As such, the program operations may be performed from top to bottom according to the stacked order of the word lines, and program operations for the word line WL1 arranged at the lowest level may be performed last in an order of the second, sixth, third, seventh, first, fourth, fifth, and eighth string select lines SSL2, SSL6, SSL3, SSL7, SSL1, SSL4, SSL5, and SSL8. Accordingly, an order of programming memory cells connected to the word line WL1 and the eighth string select line SSL8 may be determined to be last.

FIG. 12C illustrates another example of a program order with respect to the memory device 122 of FIG. 12A.

Referring to FIG. 12C, when a program operation is performed on the plurality of word lines WL1 to WLn in the B2T manner, the word line WL1 arranged at the lowest level may be programmed first, and subsequently, the word line WL2 arranged over the word line WL1 may be programmed. Here, the program order of the plurality of pages included in each word line may be determined through normal scramble such that the plurality of pages are programmed in an order different from the physical arrangement order of the string select lines. Program operations for the word line WL1 may be performed in an order of the second, sixth, third, seventh, first, fourth, fifth, and eighth string select lines SSL2, SSL6, SSL3, SSL7, SSL1, SSL4, SSL5, and SSL8, and subsequently, program operations for the word line WL2 may be performed in an order of the second, sixth, third, seventh, first, fourth, fifth, and eighth string select lines SSL2, SSL6, SSL3, SSL7, SSL1, SSL4, SSL5, and SSL8. As such, the word lines may be programmed from bottom to top according to the stacked order of the word lines, and the word line WLn arranged at the highest level may be programmed last in an order of the second, sixth, third, seventh, first, fourth, fifth, and eighth string select lines SSL2, SSL6, SSL3, SSL7, SSL1, SSL4, SSL5, and SSL8. Accordingly, an order of programming memory cells connected to the word line WLn and the eighth string select line SSL8 may be determined to be last.

Figure 13A:
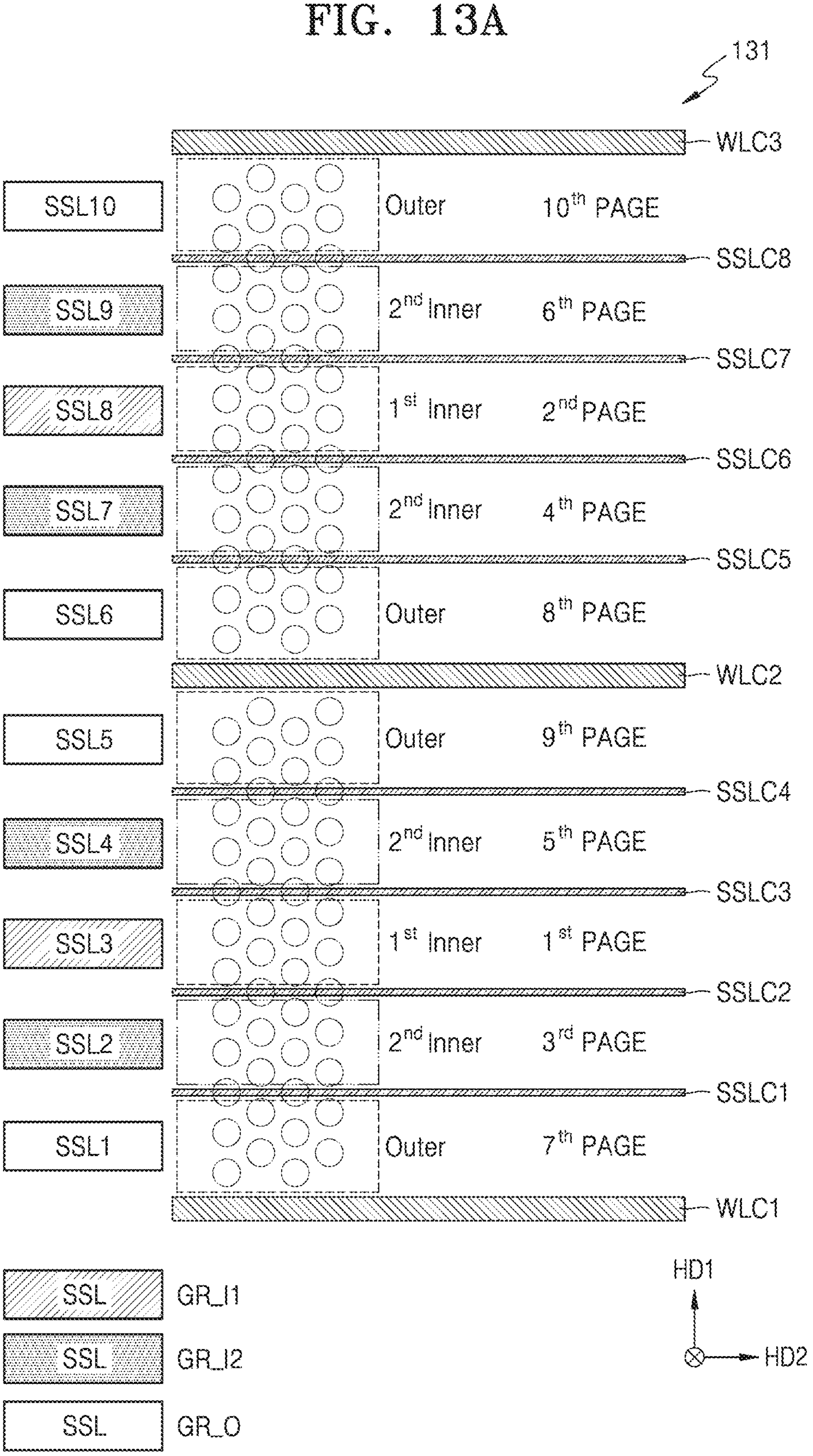
FIG. 13A is a plan view illustrating a memory device according to an embodiment.

FIG. 13A is a plan view illustrating a memory device 131 according to an embodiment.

Referring to FIG. 13A, the memory device 131 may have a 10SSL structure in which each memory block ten string select lines. Here, each memory block may include a plurality of pages defined by the first to third word line cut regions WLC1 to WLC3 and first to eighth string select line cut regions SSLC1 to SSLC8. Here, channel holes corresponding to the third and eighth string select lines SSL3 and SSL8 may be included in a first inner channel hole group GR_I1 having a largest distance from an adjacent word line cut region, channel holes corresponding to the second, fourth, seventh, and ninth string select lines SSL2, SSL4, SSL7, and SSL9 may be included in a second inner channel hole group GR_I2 having a second largest distance from the adjacent word line cut region, and channel holes corresponding to the first, fifth, sixth, and tenth string select lines SSL1, SSL5, SSL6, and SSL10 may be included in the outer channel hole group GR_O having a relatively small distance from the adjacent word line cut region. According to the present embodiment, the plurality of pages connected to a selected word line may be programmed in an order of the third string select line SSL3, the eighth string select line SSL8, the second string select line SSL2, the seventh string select line SSL7, the fourth string select line SSL4, the ninth string select line SSL9, the first string select line SSL1, the sixth string select line SSL6, the fifth string select line SSL5, and the tenth string select line SSL10.

FIG. 13B illustrates one example of a program order with respect to the memory device 131 of FIG. 13A.

Referring to FIG. 13B, when a program operation is performed on the plurality of word lines WL1 to WLn in the T2B manner, the word line WLn arranged at the highest level may be programmed first, and subsequently, the word line WLn—1 arranged under the word line WLn may be programmed. Here, a program order of the plurality of pages included in each word line may be determined through normal scramble such that the plurality of pages are programmed in an order different from the physical arrangement order of the string select lines. Program operations for the word line WLn may be performed in an order of the third, eighth, second, seventh, fourth, ninth, first, sixth, fifth, and tenth string select lines SSL3, SSL8, SSL2, SSL7, SSL4, SSL9, SSL1, SSL6, SSL5, and SSL10, and subsequently, program operations for the word line WLn−1 may be performed in an order of the third, eighth, second, seventh, fourth, ninth, first, sixth, fifth, and tenth string select lines SSL3, SSL8, SSL2, SSL7, SSL4, SSL9, SSL1, SSL6, SSL5, and SSL10. As such, the program operations may be performed from top to bottom according to a stacked order of the word lines, and program operations for the word line WL1 arranged at the lowest level may be performed last in an order of the third, eighth, second, seventh, fourth, ninth, first, sixth, fifth, and tenth string select lines SSL3, SSL8, SSL2, SSL7, SSL4, SSL9, SSL1, SSL6, SSL5, and SSL10. Accordingly, an order of programming memory cells connected to the word line WL1 and the tenth string select line SSL10 may be determined to be last.

FIG. 13C illustrates another example of a program order with respect to the memory device 131 of FIG. 13A.

Referring to FIG. 13C, when a program operation is performed on the plurality of word lines WL1 to WLn in the B2T manner, the word line WL1 arranged at the lowest level may be programmed first, and subsequently, the word line WL2 arranged over the word line WL1 may be programmed. Here, the program order of the plurality of pages included in each word line may be determined through normal scramble such that the plurality of pages are programmed in an order different from the physical arrangement order of the string select lines. Program operations for the word line WL1 may be performed in an order of the third, eighth, second, seventh, fourth, ninth, first, sixth, fifth, and tenth string select lines SSL3, SSL8, SSL2, SSL7, SSL4, SSL9, SSL1, SSL6, SSL5, and SSL10, and subsequently, program operations for the word line WL2 may be performed in an order of the third, eighth, second, seventh, fourth, ninth, first, sixth, fifth, and tenth string select lines SSL3, SSL8, SSL2, SSL7, SSL4, SSL9, SSL1, SSL6, SSL5, and SSL10. As such, the program operations may be performed from bottom to top according to the stacked order of the word lines, and program operations for the word line WLn arranged at the highest level may be performed last in an order of the third, eighth, second, seventh, fourth, ninth, first, sixth, fifth, and tenth string select lines SSL3, SSL8, SSL2, SSL7, SSL4, SSL9, SSL1, SSL6, SSL5, and SSL10. Accordingly, an order of programming memory cells connected to the word line WLn and the tenth string select line SSL10 may be determined to be last.

Figure 14A:
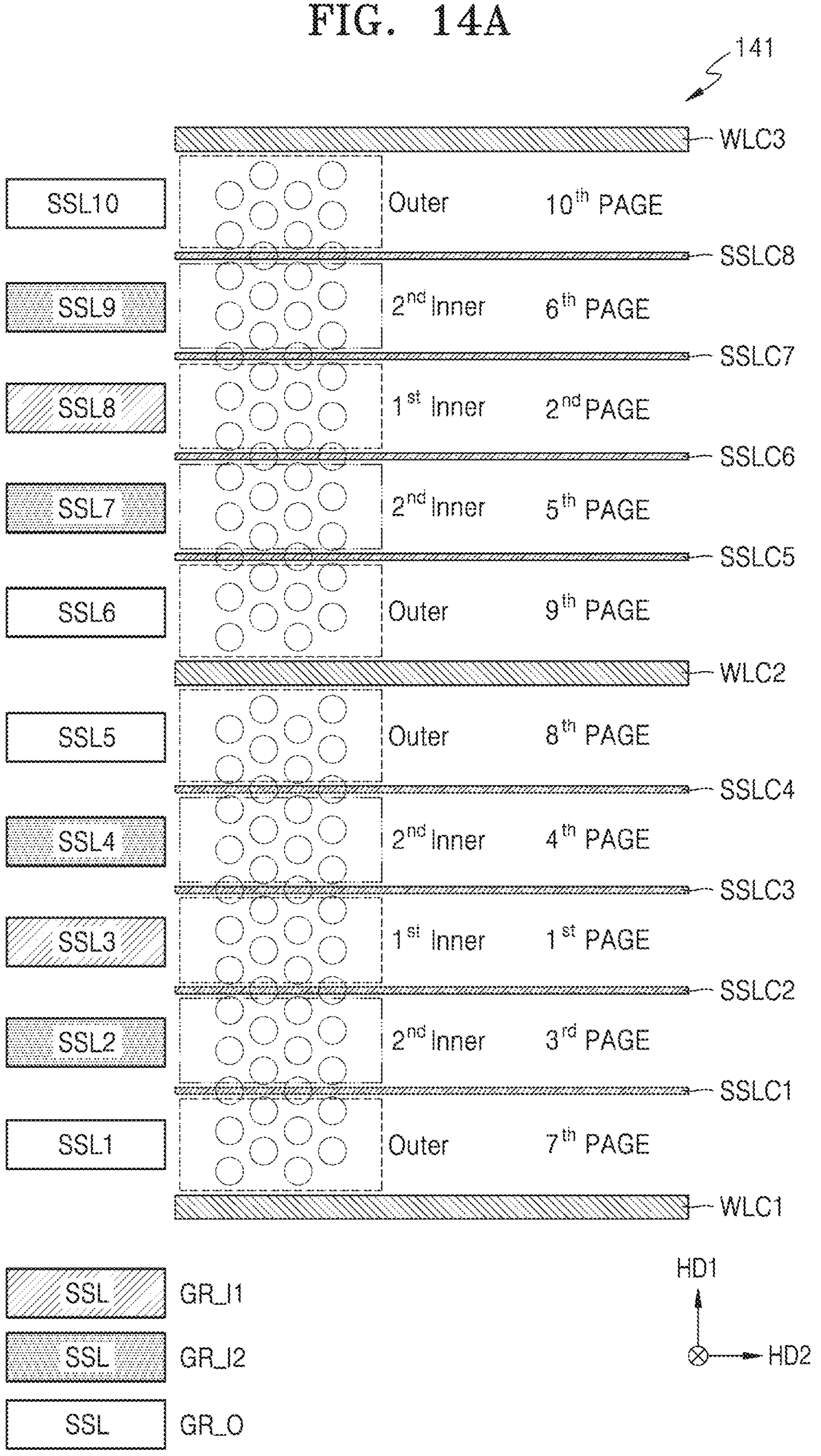
FIG. 14A is a plan view illustrating a memory device according to an embodiment.

FIG. 14A is a plan view illustrating a memory device 141 according to an embodiment.

Referring to FIG. 14A, the memory device 141 may correspond to a modified example of the memory device 131 of FIG. 13A, and the descriptions made above with reference to FIG. 13A may be applied to the present embodiment. According to the present embodiment, the plurality of pages connected to the selected word line may be programmed in an order of the third string select line SSL3, the eighth string select line SSL8, the second string select line SSL2, the fourth string select line SSL4, the seventh string select line SSL7, the ninth string select line SSL9, the first string select line SSL1, the fifth string select line SSL5, the sixth string select line SSL6, and the tenth string select line SSL10.

FIG. 14B illustrates one example of a program order with respect to the memory device 141 of FIG. 14A.

Referring to FIG. 14B, when a program operation is performed on the plurality of word lines WL1 to WLn in the T2B manner, the word line WLn arranged at the highest level may be programmed first, and subsequently, the word line WLn−1 arranged under the word line WLn may be programmed. Here, the program order of the plurality of pages included in each word line may be determined through normal scramble such that the plurality of pages are programmed in an order different from the physical arrangement order of the string select lines. Program operations for the word line WLn may be performed in an order of the third, eighth, second, fourth, seventh, ninth, first, fifth, sixth, and tenth string select lines SSL3, SSL8, SSL2, SSL4, SSL7, SSL9, SSL1, SSL5, SSL6, and SSL10, and subsequently, program operations for the word line WLn−1 may be performed in an order of the third, eighth, second, fourth, seventh, ninth, first, fifth, sixth, and tenth string select lines SSL3, SSL8, SSL2, SSL4, SSL7, SSL9, SSL1, SSL5, SSL6, and SSL10. As such, the program operations may be performed from top to bottom according to the stacked order of the word lines, and program operations for the word line WL1 arranged at the lowest level may be performed last in an order of the third, eighth, second, fourth, seventh, ninth, first, fifth, sixth, and tenth string select lines SSL3, SSL8, SSL2, SSL4, SSL7, SSL9, SSL1, SSL5, SSL6, and SSL10. Accordingly, an order of programming memory cells connected to the word line WL1 and the tenth string select line SSL10 may be determined to be last.

FIG. 14C illustrates another example of a program order with respect to the memory device 141 of FIG. 14A.

Referring to FIG. 14C, when a program operation is performed on the plurality of word lines WL1 to WLn in the B2T manner, the word line WL1 arranged at the lowest level may be programmed first, and subsequently, the word line WL2 arranged over the word line WL1 may be programmed. Here, the program order of the plurality of pages included in each word line may be determined through normal scramble such that the plurality of pages are programmed in an order different from the physical arrangement order of the string select lines. Program operations for the word line WL1 may be performed in an order of the third, eighth, second, fourth, seventh, ninth, first, fifth, sixth, and tenth string select lines SSL3, SSL8, SSL2, SSL4, SSL7, SSL9, SSL1, SSL5, SSL6, and SSL10, and subsequently, program operations for the word line WL2 may be performed in an order of the third, eighth, second, seventh, fourth, ninth, first, fifth, sixth, and tenth string select lines SSL3, SSL8, SSL2, SSL4, SSL7, SSL9, SSL1, SSL5, SSL6, and SSL10. As such, the program operations may be performed from bottom to top according to the stacked order of the word lines, and program operations for the word line WLn arranged at the highest level may be performed last in an order of the third, eighth, second, fourth, seventh, ninth, first, fifth, sixth, and tenth string select lines SSL3, SSL8, SSL2, SSL4, SSL7, SSL9, SSL1, SSL5, SSL6, and SSL10. Accordingly, an order of programming memory cells connected to the word line WLn and the tenth string select line SSL10 may be determined to be last.

FIG. 15 illustrates a program order with respect to a memory device, according to an embodiment.

Referring to FIG. 15, when the memory device has a 12SSL structure in which each memory block included in the memory device includes twelve string select lines, channel holes corresponding to third, fourth, ninth, and tenth string select lines SSL3, SSL4, SSL9, and SSL10 may be included in the first inner channel hole group GR_I1 having a largest distance from an adjacent word line cut region, channel holes corresponding to second, fifth, eighth, and eleventh string select lines SSL2, SSL5, SSL8, and SSL11 may be included in the second inner channel hole group GR_I2 having a second largest distance from the adjacent word line cut region, and channel holes corresponding to first, sixth, seventh, and twelfth string select lines SSL1, SSL6, SSL7, and SSL12 may be included in the outer channel hole group GR_O having a relatively small distance from the adjacent word line cut region.

According to one embodiment, a plurality of pages connected to a selected word line may be programmed in an order of the third, ninth, fourth, tenth, second, eighth, fifth, eleventh, first, sixth, seventh, and twelfth string select lines SSL3, SSL9, SSL4, SSL10, SSL2, SSL8, SSL5, SSL11, SSL1, SSL6, SSL7, and SSL12. In addition, when a program operation is performed in the T2B manner, the programming may be performed in the program order as shown in the table of FIG. 15. However, embodiments are not limited thereto, and the program operation may be performed in the B2Tmanner.

According to another embodiment, the plurality of pages connected to the selected word line may be programmed in an order of the third, ninth, fourth, tenth, second, eighth, fifth, eleventh, first, seventh, sixth, and twelfth string select lines SSL3, SSL9, SSL4, SSL10, SSL2, SSL8, SSL5, SSL11, SSL1, SSL7, SSL6, and SSL12. According to yet another embodiment, the plurality of pages connected to the selected word line may be programmed in an order of the third, fourth, ninth, tenth, second, eighth, fifth, eleventh, first, seventh, sixth, and twelfth string select lines SSL3, SSL4, SSL9, SSL10, SSL2, SSL8, SSL5, SSL11, SSL1, SSL7, SSL6, and SSL12. As such, a program operation may be performed on the first inner channel hole group GR_I1, a program operation may be subsequently performed on the second inner channel hole group GR_I2, and then, a program operation may be performed on the outer channel hole group GR_O. Here, memory cells corresponding to the string select lines included in the same hole group may be consecutively programmed.

FIG. 16 illustrates a program order with respect to a memory device, according to an embodiment.

Referring to FIG. 16, when the memory device has a 14SSL structure in which each memory block included in the memory device includes fourteen string select lines, channel holes corresponding to fourth and eleventh string select lines SSL4 and SSL11 may be included in the first inner channel hole group GR_Il having a largest distance from an adjacent word line cut region, channel holes corresponding to third, fifth, tenth, and twelfth string select lines SSL3, SSL5, SSL10, and SSL12 may be included in the second inner channel hole group GR_I2 having a second largest distance from the adjacent word line cut region, channel holes corresponding to second, sixth, ninth, and thirteenth string select lines SSL2, SSL6, SSL9, and SSL13 may be included in a third inner channel hole group GR_I3 having a third largest distance from the adjacent word line cut region, and channel holes corresponding to first, seventh, eighth, and fourteenth string select lines SSL1, SSL7, SSL8, and SSL14 may be included in the outer channel hole group GR_O having a relatively small distance from the adjacent word line cut region.

According to one embodiment, a plurality of pages connected to a selected word line may be programmed in an order of the fourth, eleventh, third, tenth, fifth, twelfth, second, ninth, sixth, thirteenth, first, eighth, seventh, and fourteenth string select lines SSL4, SSL11, SSL3, SSL10, SSL5, SSL12, SSL2, SSL9, SSL6, SSL13, SSL1, SSL8, SSL7, and SSL14. In addition, when a program operation is performed in the T2B manner, the programming may be performed in the program order as shown in the table of FIG. 16. However, embodiments are not limited thereto, and the program operation may be performed in the B2Tmanner.

According to another embodiment, the plurality of pages connected to the selected word line may be programmed in an order of the fourth, eleventh, third, tenth, fifth, twelfth, second, ninth, sixth, thirteenth, first, seventh, eighth, and fourteenth string select lines SSL4, SSL11, SSL3, SSL10, SSL5, SSL12, SSL2, SSL9, SSL6, SSL13, SSL1, SSL7, SSL8, and SSL14. According to yet another embodiment, the plurality of pages connected to the selected word line may be programmed in an order of the fourth, eleventh, third, fifth, tenth, twelfth, second, ninth, sixth, thirteenth, first, eighth, seventh, and fourteenth string select lines SSL4, SSL11, SSL3, SSL5, SSL10, SSL12, SSL2, SSL9, SSL6, SSL13, SSL1, SSL8, SSL7, and SSL14. As such, a program operation may be performed on the first inner channel hole group GR_I1, a program operation may be subsequently performed on the second inner channel hole group GR_I2, a program operation may be subsequently performed on the third inner channel hole group GR_I3, and then, a program operation may be performed on the outer channel hole group GR_O. Here, memory cells corresponding to the string select lines included in the same hole group may be consecutively programmed.

Figure 17:
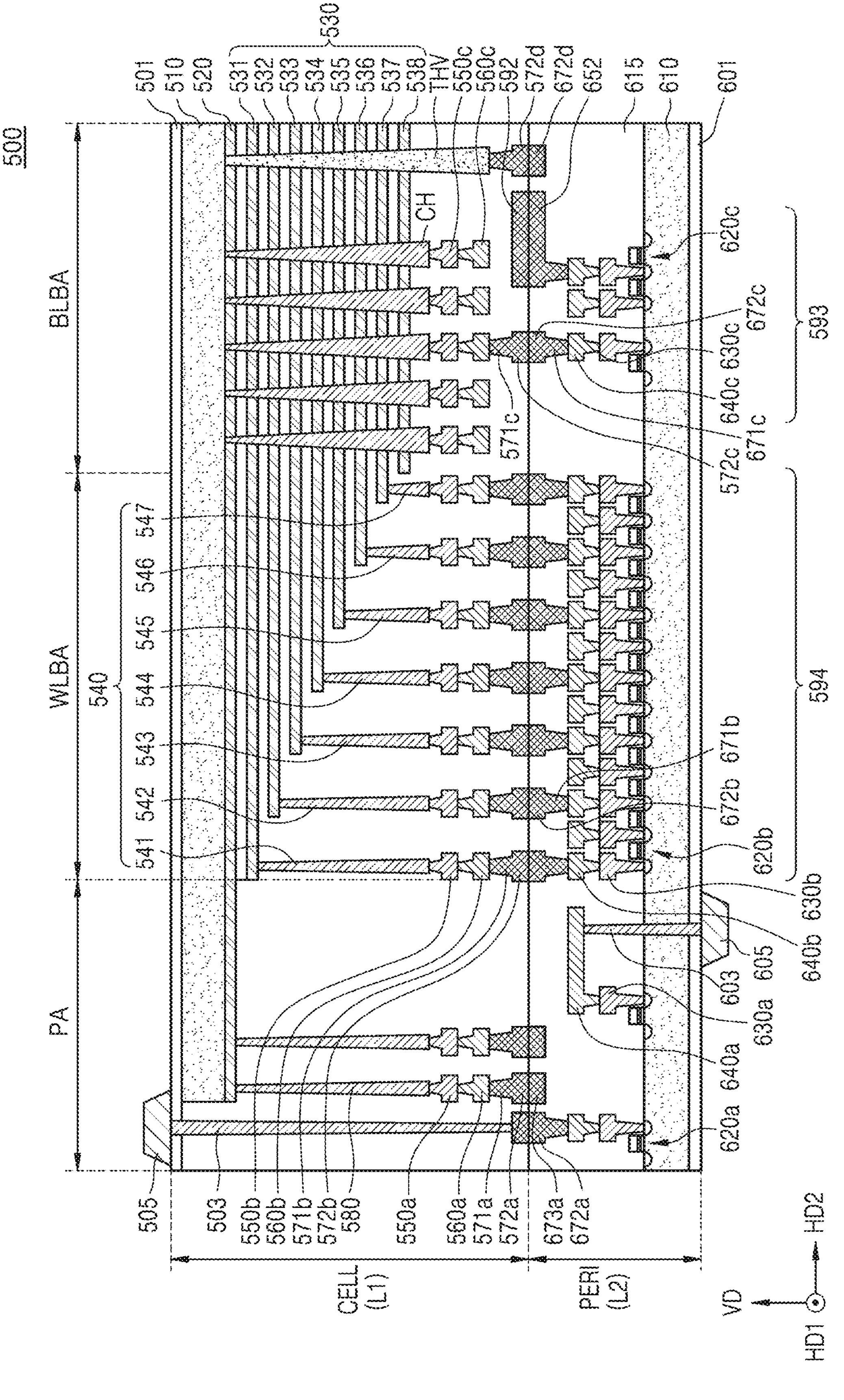
FIG. 17 is a cross-sectional view of a memory device having a B-VNAND structure, according to an embodiment.

FIG. 17 is a cross-sectional view of a memory device having a bonding vertical NAND (B-VNAND) structure, according to an embodiment. When non-volatile memory included in the memory device is implemented by flash memory, the non-volatile memory may have a structure shown in FIG. 17.

Referring to FIG. 17, a cell region CELL of a memory device 500 may correspond to a first semiconductor layer L1, and a peripheral circuit region PERI of the memory device 500 may correspond to a semiconductor layer L2. Each of the peripheral circuit region PERI and the cell region CELL of the memory device 500 may include an external pad bonding area PA, a word line bonding area WLBA, and a bit line bonding area BLBA. For example, the plurality of word lines WL, the plurality of string select lines SSL, the plurality of ground select lines GSL, and the memory cell array 110 in FIG. 2 may be formed in the first semiconductor layer L1, and the control logic circuit 120, the row decoder 130, the voltage generator 140, and the page buffer circuit 150 in FIG. 2 may be formed in the second semiconductor layer L2.

The peripheral circuit region PERI may include a first substrate 610, an interlayer insulating layer 615, a plurality of circuit elements 620*a*, 620*b*, and 620*c* formed on the first substrate 610, first metal layers 630*a*, 630*b*, and 630*c* respectively connected to the plurality of circuit elements 620*a*, 620*b*, and 620*c*, and second metal layers 640*a*, 640*b*, and 640*c* respectively formed on the first metal layers 630*a*, 630*b*, and 630*c*. In an example embodiment, the first metal layers 630*a*, 630*b*, and 630*c* may be formed of tungsten having relatively high resistivity, and the second metal layers 640*a*, 640*b*, and 640*c* may be formed of copper having relatively low resistivity.

In an example embodiment, although only the first metal layers 630*a*, 630*b*, and 630*c* and the second metal layers 640*a*, 640*b*, and 640*c* are shown and described, example embodiments are not limited thereto, and one or more additional metal layers may be further formed on the second metal layers 640*a*, 640*b*, and 640*c*. At least a portion of the one or more additional metal layers formed on the second metal layers 640*a*, 640*b*, and 640*c* may be formed of aluminum or the like having a lower resistivity than those of copper forming the second metal layers 640*a*, 640*b*, and 640*c*.

The interlayer insulating layer 615 may be disposed on the first substrate 610 and cover the plurality of circuit elements 620*a*, 620*b*, and 620*c*, the first metal layers 630*a*, 630*b*, and 630*c*, and the second metal layers 640*a*, 640*b*, and 640*c*. The interlayer insulating layer 615 may include an insulating material such as silicon oxide, silicon nitride, or the like.

Lower bonding metals 671*b* and 672*b* may be formed on the second metal layer 640*b* in the word line bonding area WLBA. In the word line bonding area WLBA, the lower bonding metals 671*b* and 672*b* in the peripheral circuit region PERI may be electrically bonded to upper bonding metals 571*b* and 572*b* of the cell region CELL. The lower bonding metals 671*b* and 672*b* and the upper bonding metals 571*b* and 572*b* may be formed of aluminum, copper, tungsten, or the like. Further, the upper bonding metals 571*b* and 572*b* in the cell region CELL may be referred as first metal pads and the lower bonding metals 671*b* and 672*b* in the peripheral circuit region PERI may be referred as second metal pads.

The cell region CELL may include at least one memory block. The cell region CELL may include a second substrate 510 and a common source line 520. On the second substrate 510, a plurality of word lines 531 to 538 (i.e., 530) may be stacked in a vertical direction VD, perpendicular to an upper surface of the second substrate 510. At least one string select line and at least one ground select line may be arranged on and below the plurality of word lines 530, respectively, and the plurality of word lines 530 may be disposed between the at least one string select line and the at least one ground select line.

In the bit line bonding area BLBA, a channel structure CH may extend in the vertical direction VD, perpendicular to the upper surface of the second substrate 510, and pass through the plurality of word lines 530, the at least one string select line, and the at least one ground select line. The channel structure CH may include a data storage layer, a channel layer, a buried insulating layer, and the like, and the channel layer may be electrically connected to a first metal layer 550*c* and a second metal layer 560*c*. For example, the first metal layer 550*c* may be a bit line contact, and the second metal layer 560*c* may be a bit line. In an example embodiment, the second metal layer, that is, the bit line implemented by the second metal layer 560*c* may extend in a second horizontal direction HD2 parallel to the upper surface of the second substrate 510.

In an example embodiment, an area in which the channel structure CH, the bit line, and the like are disposed may be defined as the bit line bonding area BLBA. In the bit line bonding area BLBA, the bit line may be electrically connected to the circuit elements 620*c* providing a page buffer 593 in the peripheral circuit region PERI. The bit line 560*c* may be connected to upper bonding metals 571*c* and 572*c* in the cell region CELL, and the upper bonding metals 571*c* and 572*c* may be connected to lower bonding metals 671*c* and 672*c* connected to the circuit elements 620*c* of the page buffer 593.

In the word line bonding area WLBA, the plurality of word lines 530 may extend in a first horizontal direction HD1 parallel to the upper surface of the second substrate 510, and may be connected to a plurality of cell contact plugs 541 to 547 (i.e., 540). The plurality of word lines 530 and the plurality of cell contact plugs 540 may be connected to each other in pads provided by at least a portion of the plurality of word lines 530 extending in different lengths in the second horizontal direction HD2. A first metal layer 550*b* and a second metal layer 560*b* may be connected to an upper portion of the plurality of cell contact plugs 540 connected to the plurality of word lines 530, sequentially. The plurality of cell contact plugs 540 may be connected to the peripheral circuit region PERI by the upper bonding metals 571*b* and 572*b* of the cell region CELL and the lower bonding metals 671*b* and 672*b* of the peripheral circuit region PERI in the word line bonding area WLBA.

The plurality of cell contact plugs 540 may be electrically connected to the circuit elements 620*b* providing a row decoder 594 in the peripheral circuit region PERI. In an example embodiment, operating voltages of the circuit elements 620*b* of the row decoder 594 may be different than operating voltages of the circuit elements 620*c* providing the page buffer 593. For example, operating voltages of the circuit elements 620*c* providing the page buffer 593 may be greater than operating voltages of the circuit elements 620*b* providing the row decoder 594.

A common source line contact plug 580 may be disposed in the external pad bonding area PA. The common source line contact plug 580 may be formed of a conductive material such as a metal, a metal compound, polysilicon, or the like, and may be electrically connected to the common source line 520. A first metal layer 550*a* and a second metal layer 560*a* may be stacked on an upper portion of the common source line contact plug 580, sequentially. For example, an area in which the common source line contact plug 580, the first metal layer 550*a*, and the second metal layer 560*a* are disposed may be defined as the external pad bonding area PA.

First and second input-output pads 605 and 505 may be disposed in the external pad bonding area PA. A lower insulating film 601 covering a lower surface of the first substrate 610 may be formed below the first substrate 610, and the first input-output pad 605 may be formed on the lower insulating film 601. The first input-output pad 605 may be connected to at least one of the plurality of circuit elements 620*a*, 620*b*, and 620*c* disposed in the peripheral circuit region PERI through a first input-output contact plug 603, and may be separated from the first substrate 610 by the lower insulating film 601. In addition, a side insulating film may be disposed between the first input-output contact plug 603 and the first substrate 610 to electrically separate the first input-output contact plug 603 and the first substrate 610.

An upper insulating film 501 covering the upper surface of the second substrate 510 may be formed on the second substrate 510, and the second input-output pad 505 may be disposed on the upper insulating film 501. The second input-output pad 505 may be connected to at least one of the plurality of circuit elements 620*a*, 620*b*, and 620*c* disposed in the peripheral circuit region PERI through a second input-output contact plug 503.

According to embodiments, the second substrate 510 and the common source line 520 may not be disposed in an area in which the second input-output contact plug 503 is disposed. Also, the second input-output pad 505 may not overlap the word lines 530 in the vertical direction VD. The second input-output contact plug 503 may be separated from the second substrate 510 in a direction, parallel to the upper surface of the second substrate 510, and may pass through an interlayer insulating layer of the cell region CELL to be connected to the second input-output pad 505.

According to embodiments, the first input-output pad 605 and the second input-output pad 505 may be selectively formed. For example, the memory device 500 may include only the first input-output pad 605 disposed on the first substrate 610 or the second input-output pad 505 disposed on the second substrate 510. Alternatively, the memory device 500 may include both the first input-output pad 605 and the second input-output pad 505.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 500 may include a lower metal pattern 673*a*, which corresponds to an upper metal pattern 572*a* formed in an uppermost metal layer of the cell region CELL and has the same cross-sectional shape as the upper metal pattern 572*a* of the cell region CELL so as to be connected to each other, in an uppermost metal layer of the peripheral circuit region PERI. In the peripheral circuit region PERI, the lower metal pattern 673*a* formed in the uppermost metal layer of the peripheral circuit region PERI may not be connected to a contact. Similarly, in the external pad bonding area PA, an upper metal pattern, which corresponds to the lower metal pattern formed in an uppermost metal layer of the peripheral circuit region PERI and has the same shape as a lower metal pattern of the peripheral circuit region PERI, may be formed in an uppermost metal layer of the cell region CELL.

The lower bonding metals 671*b* and 672*b* may be formed on the second metal layer 640*b* in the word line bonding area WLBA. In the word line bonding area WLBA, the lower bonding metals 671*b* and 672*b* of the peripheral circuit region PERI may be electrically connected to the upper bonding metals 571*b* and 572*b* of the cell region CELL by Cu-to-Cu bonding.

Further, in the bit line bonding area BLBA, an upper metal pattern 592, which corresponds to a lower metal pattern 652 formed in the uppermost metal layer of the peripheral circuit region PERI and has the same cross-sectional shape as the lower metal pattern 652, may be formed in an uppermost metal layer of the cell region CELL. A contact may not be formed on the upper metal pattern 592 formed in the uppermost metal layer of the cell region CELL.

Figure 18:
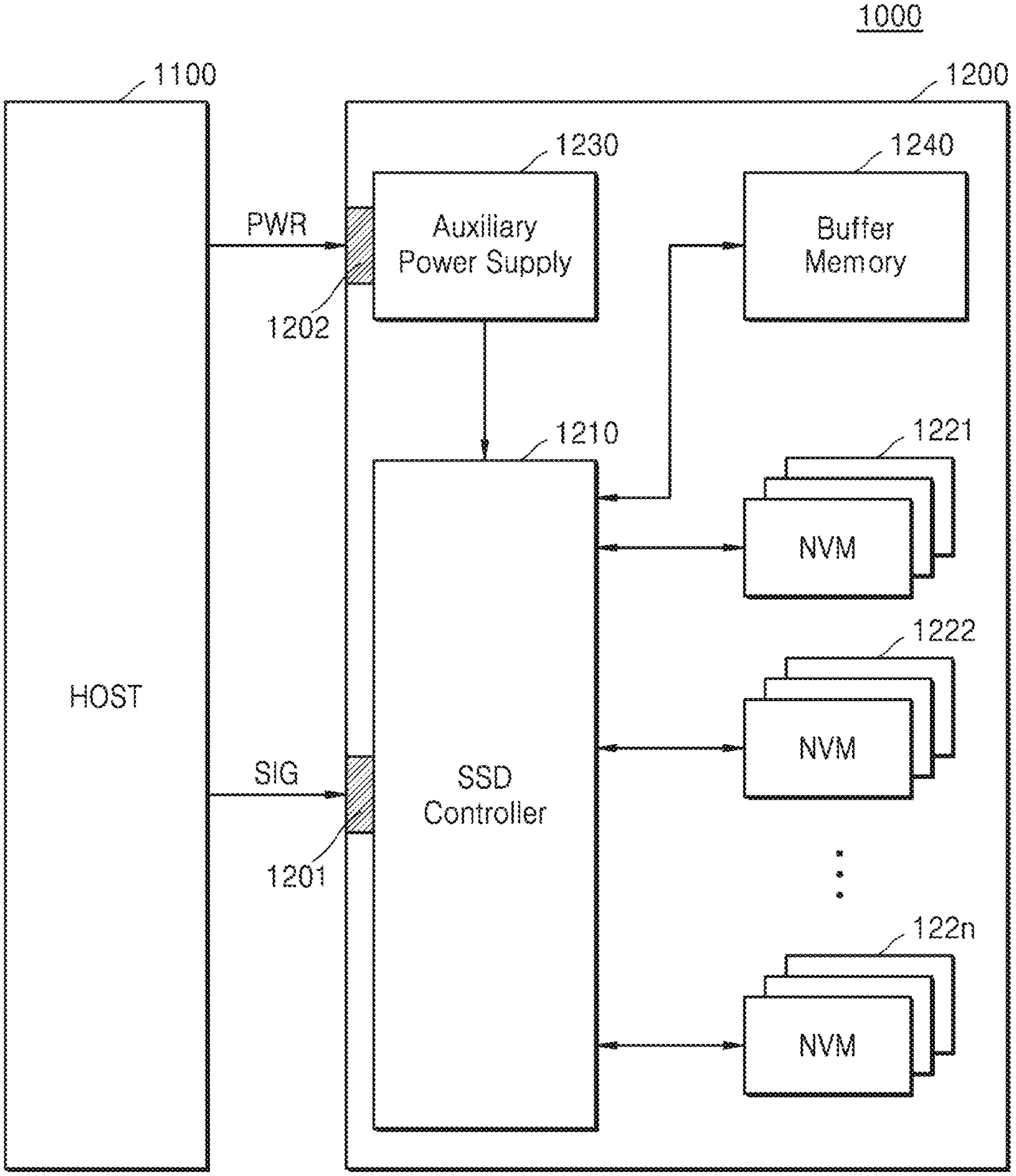
FIG. 18 is a block diagram illustrating a solid-state drive (SSD) system, to which a memory device according to an embodiment is applied.

FIG. 18 is a block diagram illustrating an SSD system 1000 to which a memory device according to an embodiment is applied.

Referring to FIG. 18, the SSD system may include a host 1100 and an SSD 1200. The SSD 1200 exchanges signals with the host 1100 via a signal connector, and receives power as input via a power connector. The SSD 1200 may include an SSD controller 1201, an auxiliary power supply 1230, and memory devices 1221, 1222, and 122*n*. The memory devices 1221, 1222, and 122*n* may each include a vertically-stacked NAND flash memory device. Here, the memory devices 1221, 1222, and 122*n* may be implemented by using embodiments described above with reference to FIGS. 1 to 17.

While aspects of embodiments shave been particularly shown and described, it will be understood that various changes in form and details may be made therein without departing from the spirit and scope of the following claims.

What is claimed is:

1. A non-volatile memory device comprising:

a plurality of word lines stacked in a vertical direction on a substrate;

a plurality of string select lines on the plurality of word lines, the plurality of string select lines being spaced apart from each other in a first horizontal direction and extending in a second horizontal direction, the first and second horizontal directions being parallel with a surface of the substrate, and the second horizontal direction being perpendicular to the first horizontal direction; and a memory cell array comprising a plurality of memory blocks, each of which comprises a plurality of memory cells connected to the plurality of word lines and the plurality of string select lines, wherein the plurality of string select lines comprise a first string select line, a second string select line and a third string select line which are arranged in the first horizontal direction between a first word line cut region and a second word line cut region, and the second string select line is provided between the first string select line and the third string select line, wherein the first string select line is between the first word line cut region and the second string select line, and the third string select line is between the second word line cut region and the second string select line, wherein a program operation on second memory cells connected to a selected word line and the second string select line is performed before program operations on first memory cells connected to the selected word line and the first string select line and third memory cells connected to the selected word line and the third string select line, and wherein a program order of the plurality of memory cells connected to the selected word line is different from a physical arrangement order of the plurality of string select lines.

2. The non-volatile memory device of claim 1, wherein a program speed for the second memory cells is lower than a program speed for the first memory cells.

3. The non-volatile memory device of claim 2, wherein channel hole sizes of channel structures corresponding to the first memory cells are substantially equal to channel hole sizes of channel structures corresponding to the second memory cells.

4. The non-volatile memory device of claim 2, further comprising a plurality of bit lines above the plurality of string select lines, the plurality of bit lines being spaced apart from each other in the second horizontal direction and extending in the first horizontal direction, wherein the second memory cells are respectively connected to the plurality of bit lines, and wherein program operations on the second memory cells are simultaneously performed.

5. The non-volatile memory device of claim 2, wherein the plurality of word lines comprise a first word line and a second word line which is farther from the substrate than the first word line, and wherein during program operations on memory cells connected to the first and second word lines, the program operations are sequentially performed on memory cells connected to the second word line and the second string select line, memory cells connected to the second word line and the first string select line, memory cells connected to the first word line and the second string select line, and memory cells connected to the first word line and the first string select line.

6. The non-volatile memory device of claim 2, wherein the plurality of word lines comprise a first word line and a second word line which is farther from the substrate than the first word line, and wherein during program operations on memory cells connected to the first and second word lines, the program operations are sequentially performed on memory cells connected to the first word line and the second string select line, memory cells connected to the first word line and the first string select line, memory cells connected to the second word line and the second string select line, and memory cells connected to the second word line and the first string select line.

7. The non-volatile memory device of claim 2, wherein the plurality of string select lines further comprise:

a fourth string select line, a fifth string select line, and a sixth string select line, which are arranged in the first horizontal direction between the second word line cut region and a third word line cut region, and wherein, program operations on memory cells connected to the fifth string select line are performed before program operations on memory cells connected to the fourth, and sixth string select lines.

8. The non-volatile memory device of claim 7, wherein program operations performed on memory cells connected to the first and fourth string select lines are performed before program operations on memory cells connected to the third and sixth string select lines.

9. The non-volatile memory device of claim 7, wherein a program operation on the second memory cells connected to the selected word line and the second string select line is performed before a program operation on memory cells connected to the selected word line and the fifth string select line.

10. The non-volatile memory device of claim 2, wherein the plurality of string select lines comprise:

the first string select line, the second string select line, the third string select line, and a fourth string select line, which are arranged in the first horizontal direction between the first word line cut region and the second word line cut region; and a fifth string select line, a sixth string select line, a seventh string select line, and an eighth string select line, which are arranged in the first horizontal direction between the second word line cut region and a third word line cut region, and wherein program operations on memory cells connected to the second, third, sixth, and seventh string select lines are performed before program operations on memory cells connected to the first, fourth, fifth, and eighth string select lines.

11. The non-volatile memory device of claim 10, wherein a program operation on memory cells connected to the first and fourth string select lines is performed before a program operation on memory cells connected to the fifth and eighth string select lines.

12. The non-volatile memory device of claim 10, wherein a program operation on the second memory cells connected to the selected word line and the second string select line is performed before a program operation on memory cells connected to the selected word line and the sixth string select line.

13. The non-volatile memory device of claim 2, wherein the plurality of word lines, the plurality of string select lines, and the memory cell array are arranged in a memory cell region, wherein the memory cell array further comprises a first metal pad, wherein the non-volatile memory device further comprises a peripheral circuit region, which comprises a second metal pad, wherein the peripheral circuit region is connected to the memory cell region via the first metal pad and the second metal pad, and wherein the first metal pad and the second metal pad are connected to each other in a bonding manner.

14. A non-volatile memory device comprising:

a plurality of word lines stacked in a vertical direction on a substrate;

a plurality of string select lines on the plurality of word lines, the plurality of string select lines being spaced apart from each other in a first horizontal direction and extending in a second horizontal direction, the first and second horizontal directions being parallel with a surface of the substrate, and the second horizontal direction being perpendicular to the first horizontal direction; and a memory cell array comprising a plurality of memory blocks, each of which comprises a plurality of memory cells connected to the plurality of word lines and the plurality of string select lines, wherein the plurality of string select lines comprise a first string select line, a second string select line, and a third string select line, wherein the second string select line is farther from a first word line cut region than the first string select line, and the second string select line is farther from a second word line cut region than the third string select line, wherein a program operation on second memory cells connected to a selected word line and the second string select line is performed before a program operation on first memory cells connected to the selected word line and the first string select line, and wherein a program speed for the second memory cells is lower than a program speed for the first memory cells.

15. The non-volatile memory device of claim 14, wherein a program order of the plurality of memory cells connected to the selected word line is different from a physical arrangement order of the plurality of string select lines.

16. The non-volatile memory device of claim 14, wherein channel hole sizes of channel structures corresponding to the first memory cells are substantially equal to channel hole sizes of channel structures corresponding to the second memory cells.

17. The non-volatile memory device of claim 14, further comprising a plurality of bit lines above the plurality of string select lines, the plurality of bit lines being spaced apart from each other in the second horizontal direction and extending in the first horizontal direction, wherein the second memory cells are respectively connected to the plurality of bit lines, and wherein program operations on the second memory cells are simultaneously performed.

18. The non-volatile memory device of claim 14, wherein the plurality of word lines comprise a first word line and a second word line which is farther from the substrate than the first word line, and wherein during program operations on memory cells connected to the first and second word lines, the program operations are sequentially performed on memory cells connected to the second word line and the second string select line, memory cells connected to the second word line and the first string select line, memory cells connected to the first word line and the second string select line, and memory cells connected to the first word line and the first string select line.

19. The non-volatile memory device of claim 14, wherein the plurality of word lines comprise a first word line and a second word line which is farther from the substrate than the first word line, and wherein during program operations on memory cells connected to the first and second word lines, the program operations are sequentially performed on memory cells connected to the first word line and the second string select line, memory cells connected to the first word line and the first string select line, memory cells connected to the second word line and the second string select line, and memory cells connected to the second word line and the first string select line.

20. The non-volatile memory device of claim 14, wherein the first string select line, the second string select line, and the third string select line are arranged in the first horizontal direction between the first word line cut region and the second word line cut region, wherein the plurality of string select lines further comprise a fourth string select line, a fifth string select line, and a sixth string select line, which are arranged in the first horizontal direction between the second word line cut region and a third word line cut region, and wherein program operations on memory cells connected to the second and fifth string select lines are performed before program operations on memory cells connected to the first, third, fourth, and sixth string select lines.

21. The non-volatile memory device of claim 20, wherein program operations performed on memory cells connected to the first and fourth string select lines are performed before program operations on memory cells connected to the third and sixth string select lines.

22. The non-volatile memory device of claim 20, wherein a program operation on the second memory cells connected to the selected word line and the second string select line is performed before a program operation on memory cells connected to the selected word line and the fifth string select line.

23. The non-volatile memory device of claim 14, wherein the plurality of string select lines comprise:

the first string select line, the second string select line, the third string select line, and a fourth string select line, which are arranged in the first horizontal direction between the first word line cut region and the second word line cut region; and a fifth string select line, a sixth string select line, a seventh string select line, and an eighth string select line, which are arranged in the first horizontal direction between the second word line cut region and a third word line cut region, and wherein program operations on memory cells connected to the second, third, sixth, and seventh string select lines are performed before program operations on memory cells connected to the first, fourth, fifth, and eighth string select lines.

24. The non-volatile memory device of claim 23, wherein a program operation on memory cells connected to the first and fourth string select lines is performed before a program operation on memory cells connected to the fifth and eighth string select lines.

25. The non-volatile memory device of claim 23, wherein a program operation on the second memory cells connected to the selected word line and the second string select line is performed before a program operation on memory cells connected to the selected word line and the sixth string select line.

26. The non-volatile memory device of claim 14, wherein the plurality of word lines, the plurality of string select lines, and the memory cell array are arranged in a memory cell region, wherein the memory cell array further comprises a first metal pad, wherein the non-volatile memory device further comprises a peripheral circuit region, which comprises a second metal pad, wherein the peripheral circuit region is connected to the memory cell region via the first metal pad and the second metal pad, and wherein the first metal pad and the second metal pad are connected to each other in a bonding manner.

* * * * *